(12) United States Patent
Khaderbad et al.

(10) Patent No.: US 10,998,241 B2
(45) Date of Patent: May 4, 2021

(54) SELECTIVE DUAL SILICIDE FORMATION USING A MASKLESS FABRICATION PROCESS FLOW

(71) Applicant: Taiwan Semiconductor Manufacturing Co., Ltd., Hsin-Chu (TW)

(72) Inventors: Mrunal A. Khaderbad, Hsinchu (TW); Pang-Yen Tsai, Jhubei (TW); Yasutoshi Okuno, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/454,871

(22) Filed: Jun. 27, 2019

(65) Prior Publication Data

US 2020/0091011 A1 Mar. 19, 2020

Related U.S. Application Data

(60) Provisional application No. 62/733,185, filed on Sep. 19, 2018.

(51) Int. Cl.
*H01L 21/8238* (2006.01)
*H01L 29/45* (2006.01)
*H01L 27/092* (2006.01)

(52) U.S. Cl.
CPC .......... *H01L 21/823814* (2013.01); *H01L 21/823821* (2013.01); *H01L 21/823871* (2013.01); *H01L 27/0924* (2013.01); *H01L 29/45* (2013.01)

(58) Field of Classification Search
CPC ..... H01L 21/823871; H01L 21/823814; H01L 21/823821; H01L 27/0924; H01L 29/41791; H01L 29/45
See application file for complete search history.

(56) References Cited

U.S. PATENT DOCUMENTS

| | | | |
|---|---|---|---|
| 5,612,552 A | * | 3/1997 | Owens ................ H01L 27/0688 257/202 |
| 6,383,882 B1 | | 5/2002 | Lee et al. |
| 7,425,740 B2 | | 9/2008 | Liu et al. |
| 7,667,271 B2 | | 2/2010 | Yu et al. |
| 7,910,453 B2 | | 3/2011 | Xu et al. |
| 8,048,723 B2 | | 11/2011 | Chang et al. |

(Continued)

FOREIGN PATENT DOCUMENTS

| | | |
|---|---|---|
| JP | 2006060045 | 3/2006 |
| JP | 2006202278 A | 8/2006 |

(Continued)

*Primary Examiner* — Feifei Yeung Lopez
(74) *Attorney, Agent, or Firm* — Haynes and Boone, LLP

(57) ABSTRACT

A first dielectric layer is selectively formed such that the first dielectric layer is formed over a source/drain region of a first type of transistor but not over a source/drain region of a second type of transistor. The first type of transistor and the second type of transistor have different types of conductivity. A first silicide layer is selectively formed such that the first silicide layer is formed over the source/drain region of the second type of transistor but not over the source/drain region of the first type of transistor. The first dielectric layer is removed. A second silicide layer is formed over the source/drain region of the first type of transistor.

20 Claims, 28 Drawing Sheets

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 8,921,191 B2 | 12/2014 | Cai et al. |
| 9,368,357 B2 | 6/2016 | Chang et al. |
| 9,406,804 B2 | 8/2016 | Huang et al. |
| 10,121,875 B1 * | 11/2018 | Ho .................... H01L 21/76801 |
| 2003/0109121 A1 * | 6/2003 | Rotondaro ...... H01L 21/823842 438/592 |
| 2006/0038229 A1 * | 2/2006 | Tsuchiya ......... H01L 21/823835 257/351 |
| 2006/0202278 A1 * | 9/2006 | Shima ............. H01L 21/823807 257/369 |
| 2011/0068407 A1 | 3/2011 | Yeh et al. |
| 2013/0011983 A1 | 1/2013 | Tsai et al. |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0225198 A1 | 8/2014 | Suk et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2014/0293702 A1 * | 10/2014 | Dong .................... G11C 16/10 365/185.17 |
| 2015/0028399 A1 | 1/2015 | Xiong et al. |
| 2017/0062579 A1 * | 3/2017 | Xiong ............ H01L 21/823814 |
| 2018/0151683 A1 | 5/2018 | Yeo et al. |

FOREIGN PATENT DOCUMENTS

| | | |
|---|---|---|
| JP | 2006253317 | 9/2006 |
| KR | 20140101218 | 8/2014 |
| KR | 20150018343 | 2/2015 |
| KR | 20150011658 | 2/2016 |
| KR | 20160063213 | 6/2016 |
| KR | 20160125207 | 10/2016 |
| KR | 20170116200 | 10/2017 |
| KR | 20180060906 | 6/2018 |
| TW | I253175 B | 4/2006 |
| TW | I267951 B | 12/2006 |
| TW | I588908 B | 6/2017 |
| TW | I588942 B | 6/2017 |

\* cited by examiner

SELECTIVE DUAL SILICIDE FORMATION USING A MASKLESS FABRICATION PROCESS FLOW

PRIORITY DATA

The present application is a utility application of provisional U.S. Patent Application No. 62/733,185, filed on Sep. 19, 2018, and entitled "Selective Dual Silicide Formation Using A Maskless Fabrication Process Flow", the contents of which are hereby incorporated by reference in its entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, FinFET devices use silicide to provide reduced electrical resistivity for contacts. Some conventional FinFET devices use the same silicide materials for both NFETs and PFETs, which does not optimize device performance. Other conventional FinFET devices employ extra masks and the associated additional fabrication steps to form different silicide materials for NFETs and PFETs. Using the extra masks and having to undergo the additional fabrication steps introduce additional complexity and cost into FinFET fabrication, which is also undesirable.

Therefore, although existing FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
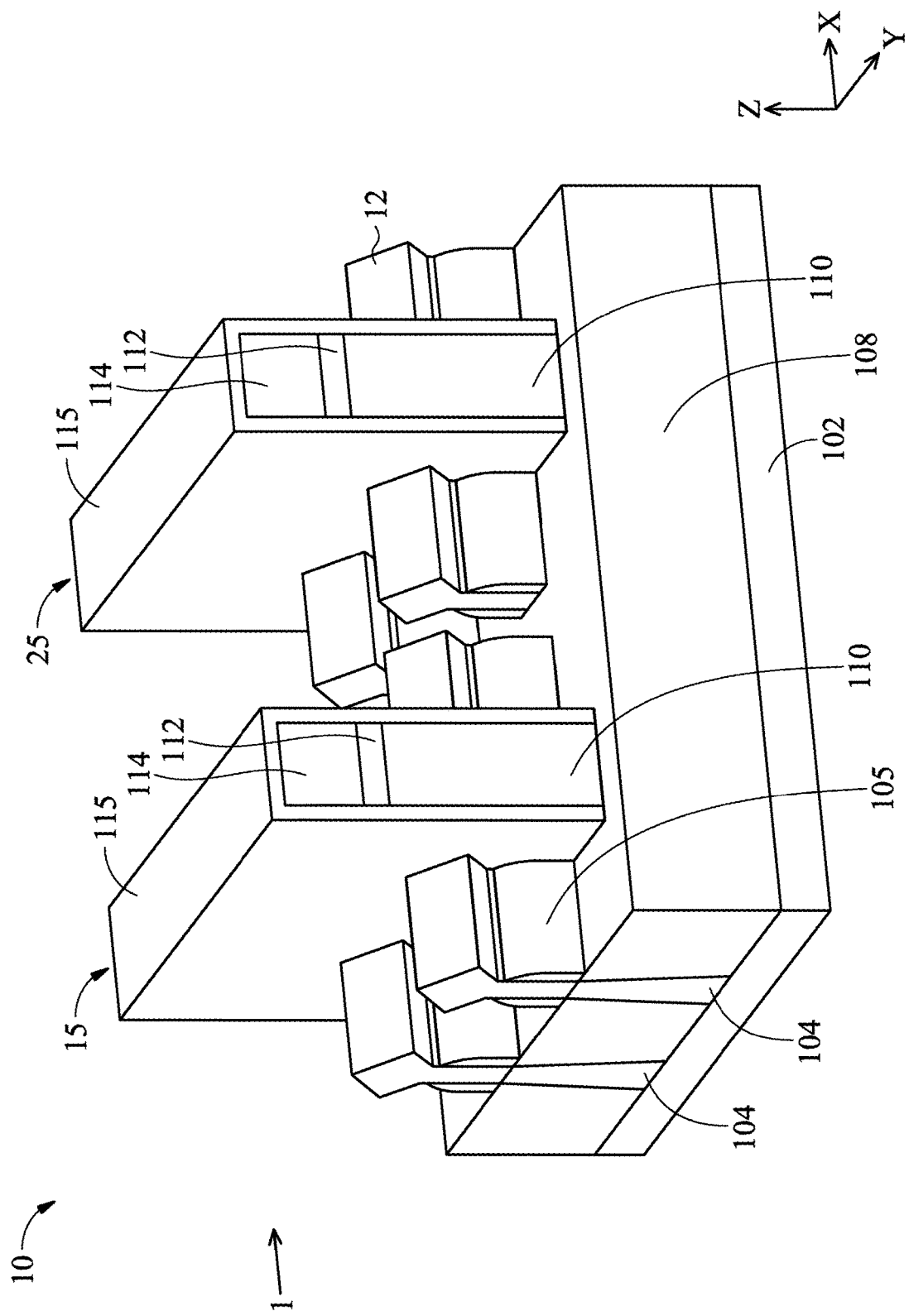
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a maskless process flow to form NFET silicide and PFET silicide separately. One type of semiconductor device in which the processes of the present disclosure may be implemented may include FinFET devices. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure may use one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structures 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, conventional FinFET fabrication may still have shortcomings. For example, metal silicides may be formed for FinFET devices to reduce electrical resistivity for contacts such as source/drain contacts. In order to optimize the reduction in the electrical resistivity for contacts, it is desirable for PFET devices to have higher work function metal silicides than NFETs. However, certain types of conventional FinFET devices employ the same type of metal silicide materials for both NFETs and PFETs, which may lead to high parasitic resistance and is therefore undesirable. Other types of conventional FinFET devices may form different types of metal silicides for the PFETs and NFETs. Unfortunately, the fabrication of these types of conventional FinFET devices requires the use of multiple lithography masks and extra lithography processes to achieve the different types of metal silicides for PFETs and NFETs. Consequently, fabrication is more complex and more costly, which is also undesirable.

To overcome the problems discussed above, the present disclosure utilizes a novel fabrication process flow to selectively form different types of metal silicides for PFETs and NFETs, without requiring extra lithography masks and the accompanying extra lithography steps. Advantageously, the fabrication processes of the present disclosure can achieve one type of metal silicides for PFETs, and another type of metal silicides for NFETs (referred to as dual silicides). For example, the different types of metal silicide materials are grown selectively over the source/drains for PFETs and NFETs. The metal silicides for the PFETs have a greater work function than the metal silicides for the NFETs. This helps to optimize the reduction in electrical resistivity for contacts.

Figure 27:
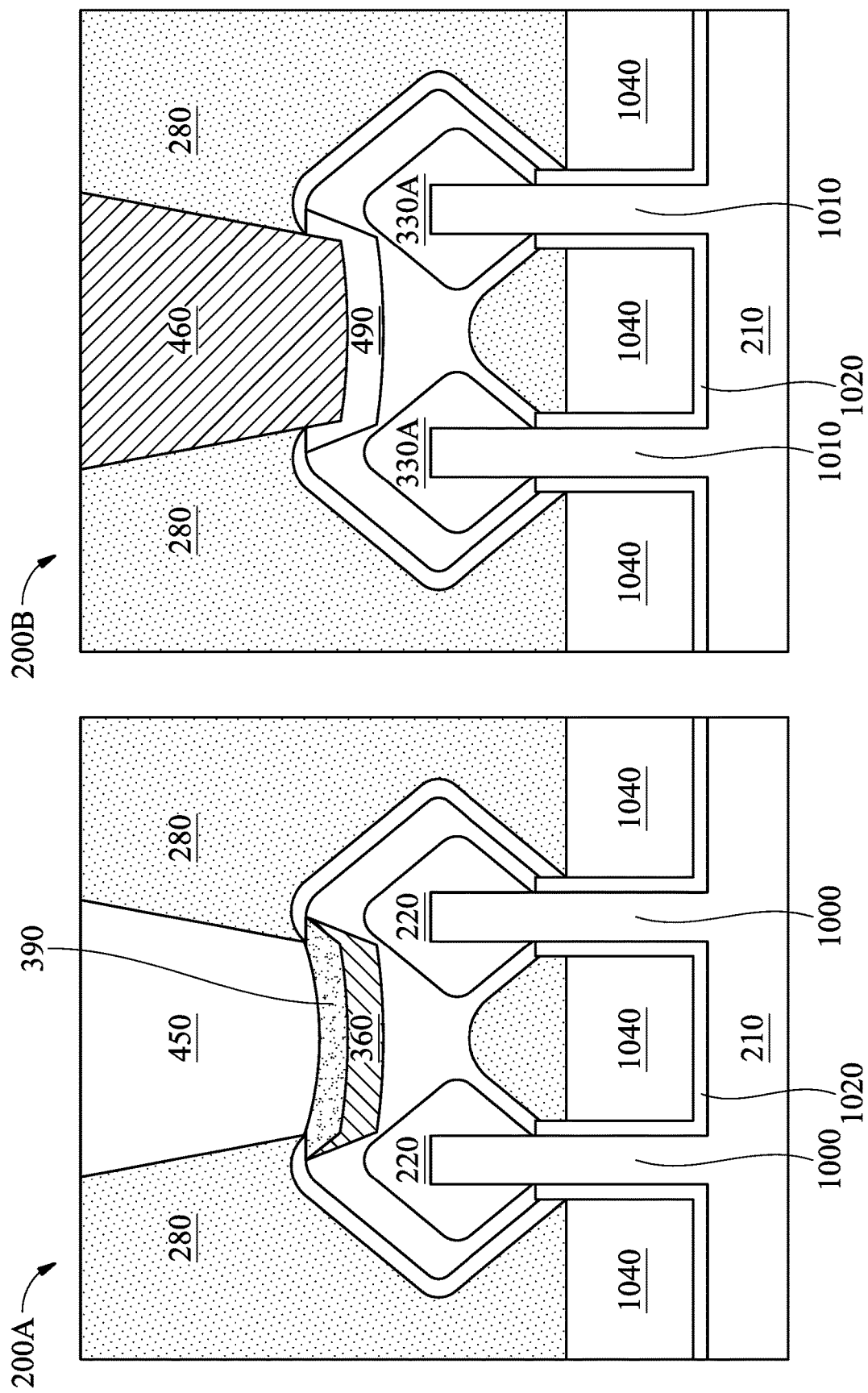
Figure 28:
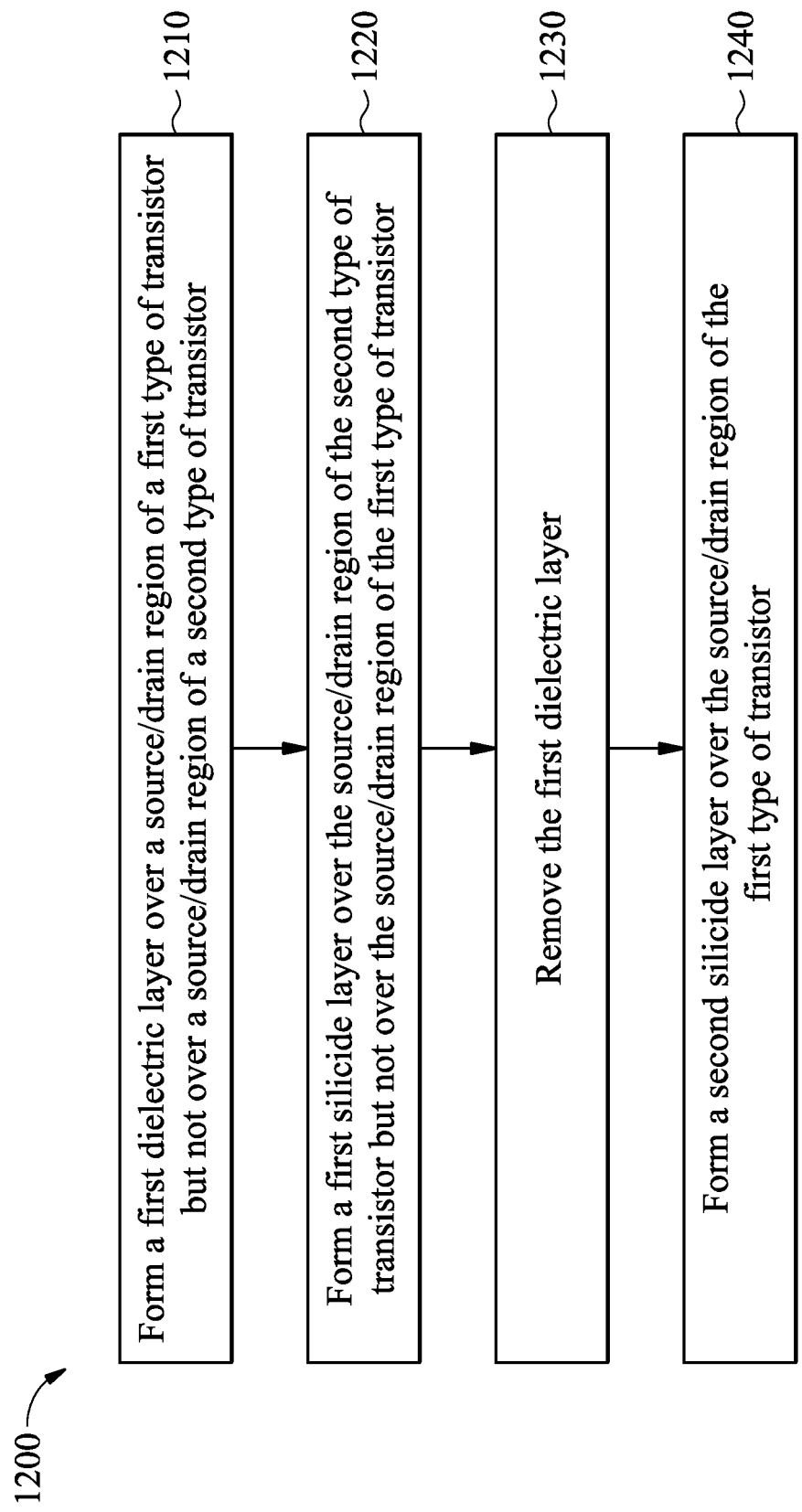
FIG. 28 is a flowchart illustrating a method of fabricating a semiconductor device according to embodiments of the present disclosure.

The various aspects of the present disclosure are discussed below in more detail with reference to FIGS. 2-28. In that regard, FIGS. 2-27 illustrate fragmentary cross-sectional side views of FinFET devices at various stages of fabrication, and FIG. 28 is a flowchart illustrating a method of fabricating a semiconductor device according to embodiments of the present disclosure.

Figure 2:
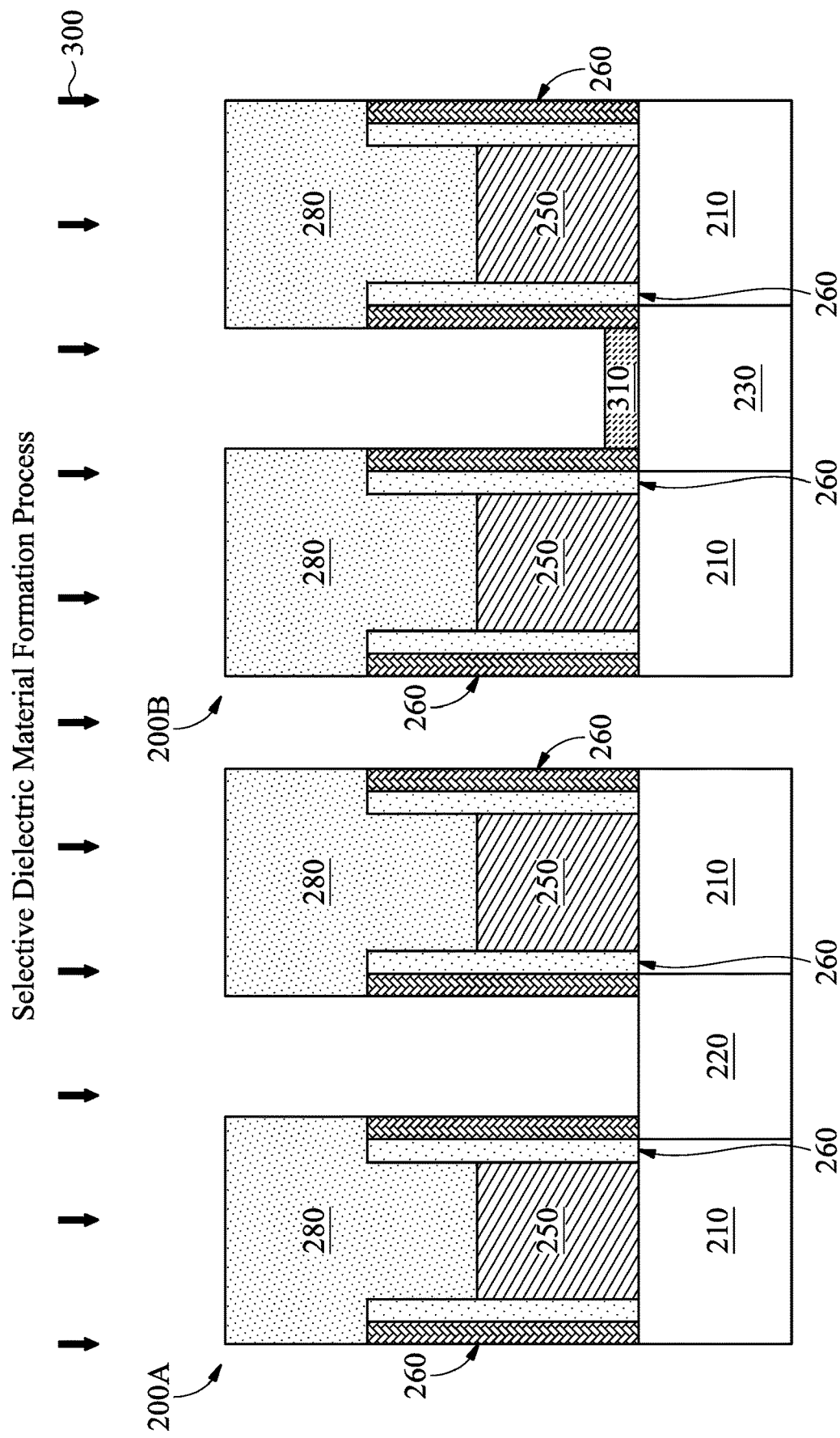
FIGS. 2-27 illustrate fragmentary illustrate fragmentary cross-sectional side views of a portion of a semiconductor device at various stages of fabrication according to different embodiments of the present disclosure.

Referring now to FIG. 2, cross-sectional side views of a semiconductor device 200A and a semiconductor device 200B are illustrated. The cross-sectional side views of FIG. 2 are taken at a plane defined by the X-direction (horizontal direction) and the Z-direction (vertical direction) of FIG. 1. Thus, the cross-sectional side views may also be referred as X-cut views. The cross-sectional views may be taken along one of the fin structures 104 in the X-direction, for example.

The semiconductor device 200A includes an n-type transistor and may be referred to as an NFET device 200A interchangeably hereinafter. The semiconductor device 200B includes a p-type transistor and may be referred to as a PFET device 200B interchangeably hereinafter. The NFET device 200A and PFET device 200B are FinFET transistors in the illustrated embodiments, but it is understood that they may be non-FinFET transistors such as planar transistors in other embodiments.

The NFET device 200A and the PFET device 200B each include a substrate 210. The substrate 210 may be implemented as an embodiment of the substrate 102 discussed above with reference to FIG. 1. In some embodiments, the substrate 210 may include a portion of the fin structure 104 of FIG. 1. In some embodiments, the substrate 210 for the NFET device 200A includes a semiconductive material, including but not limited to crystal silicon (Si), silicon phosphide (SiP), silicon carbide (SiC), silicon phosphorous carbide (SiPC), or a III-V group material such as indium phosphide (InP), gallium arsenide (GaAs), aluminum arsenide (AlAs), indium arsenide (InAs), indium aluminum arsenide (InAlAs), or indium gallium arsenide (InGaAs). In some embodiments, the substrate 210 for the PFET device 200B includes a semiconductive material, including but not limited to Si, silicon germanium (SiGe), silicon germanium boron (SiGeB), germanium, or a III-V group material such as indium antimonide (InSb), gallium antimonide (GaSb), indium gallium antimonide (InGaSb).

An ion implantation process may be performed to implant a plurality of dopant ions to the substrate 210. The dopant ions may include an n-type material for the NFET device 200A, for example arsenic (As) or phosphorous (P), or the dopant ions may include a p-type material for the PFET device 200B, for example boron (B). After the implantation process is performed, a doping concentration level in the substrate 210 may be in a range from about $1\times10^{17}$ ions/cm$^3$ to about $5\times10^{19}$ ions/cm$^3$.

The NFET device 200A includes a source/drain region 220, and the PFET device 200B includes a source/drain region 230. The source/drain regions 220 and 230 may include the epi-grown material 12 of FIG. 1. The source/drain regions 220 and 230 have different material compositions or dopants. In some embodiments, the source/drain region 220 of the NFET device 200A may include silicon phosphide (SiP), and the source/drain region 230 of the PFET device 200B may include boron doped silicon germanium (SiGeB). In other embodiments, the source/drain regions 220 and 230 may include the various materials of the substrate 210 of the NFET device 200A and the PFET device 200B discussed above, respectively.

The NFET device 200A and the PFET device 200B each include gate structures 250 disposed over the substrate 210, for example over channel regions of the substrate 210. The gate structures 250 each include a gate dielectric and a gate electrode formed over the gate dielectric. In some embodiments, the gate dielectric contains silicon oxide, and the gate electrode contains polysilicon. In other embodiments, a gate-replacement process may also be used to form high-k metal gates as the structures 250. In those embodiments, the gate dielectric contains a high-k dielectric material, and the gate electrode contains a metal material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of ZrO, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The metal material of the gate electrode may include a work function metal component and a fill metal component. The work function metal component tunes a work function of the respective transistor device (e.g., either the NFET device 200A or the PFET device 200B) so that a desired threshold voltage Vt is achieved. The fill metal component of the metal gate electrode serves as the main conductive portion of the gate electrode. The fill metal component may include tungsten, aluminum, copper, or combinations thereof. For the sake of simplicity, the gate dielectric, the work function metal component, and the fill metal component of the gate structures 250 are not separately drawn in the figures herein.

In the aforementioned gate-replacement process, a dummy gate electrode (e.g., made of polysilicon) may be formed on the high-k dielectric. After the formation of the source/drain regions 220 and 230, the dummy gate electrode may be removed and replaced by the metal gate electrode discussed above. This is referred to as a gate-last process flow. In some embodiments, the gate-replacement process may also employ a high-k last process flow, in which a dummy oxide dielectric is formed in place of the high-k dielectric. A dummy polysilicon gate electrode is formed on the dummy oxide gate dielectric. After the formation of the source/drain regions 220 and 230, the dummy oxide gate dielectric is removed along with the dummy polysilicon gate electrode. The high-k gate dielectric and the metal gate electrode may then be formed to replace the removed dummy gate dielectric and dummy gate electrode.

The NFET device 200A and the PFET device 200B each include gate spacers 260 that are disposed on sidewalls of the gate structures 250. The gate spacers 260 may include a dielectric material, for example silicon oxide, silicon nitride, silicon oxynitride, or a low-k dielectric material in various embodiments. An inter-layer (or inter-level) dielectric (ILD) layer 280 is formed over the gate structures 250 and over the gate spacers 260. The ILD layer 280 may be formed by chemical vapor deposition (CVD), high density plasma CVD, spin-on, sputtering, or other suitable methods. In some embodiments, the ILD layer 280 includes silicon oxide. In other embodiments, the ILD layer 280 may include silicon oxycarbide, zirconium oxide, hafnium oxide, a low-k material, or a high-k material.

A selective dielectric material formation process 300 is performed to selectively form a dielectric layer 310 over the source/drain region 230 of the PFET device 200B, but not over the source/drain region 220 of the NFET device 200A. In some embodiments, the selective dielectric material formation process 300 includes a process that oxidizes the semiconductive materials of the source/drain region 230, but not the semiconductive materials of the source/drain region 220. For example, in embodiments where the source/drain region 220 contains SiP but the source/drain region 230 contains boron-doped SiGe, due to the different properties of phosphorous and germanium, the process parameters (e.g., pressure, temperature, gas flow rates, etc.) of the selective dielectric material formation process 300 may be configured such that the germanium content gets oxidized, but not the phosphorous content. Consequently, the dielectric layer 310 may be formed over the source/drain region 230 but not over the source/drain region 220.

In other embodiments, the selective dielectric material formation process 300 may include a direct deposition of the dielectric layer 310. For example, the dielectric layer 310 is directly deposited on the source/drain region 230 using a deposition process such as CVD or ALD, but not on the source/drain region 220. This selective deposition may be achieved by configuring the deposition process to have more selectivity with SiGe than with SiP, for example.

Regardless of the embodiment used to form the dielectric layer 310, the selective dielectric material formation process 300 does not need lithography masks to achieve the selective formation of the dielectric layer 310, which simplifies fabrication. In some embodiments, the dielectric layer 310 is formed to have an oxide material composition such as silicon germanium oxide ($SiGeO_x$) or another suitable metal oxide. In other embodiments, the dielectric layer 310 may be formed to have a nitride material composition instead. As will become more apparent from the discussions below, one role of the dielectric layer 310 is that it prevents the formation of metal silicide for the PFET device 200B when the metal silicide is formed for the NFET device 200A.

Figure 3:
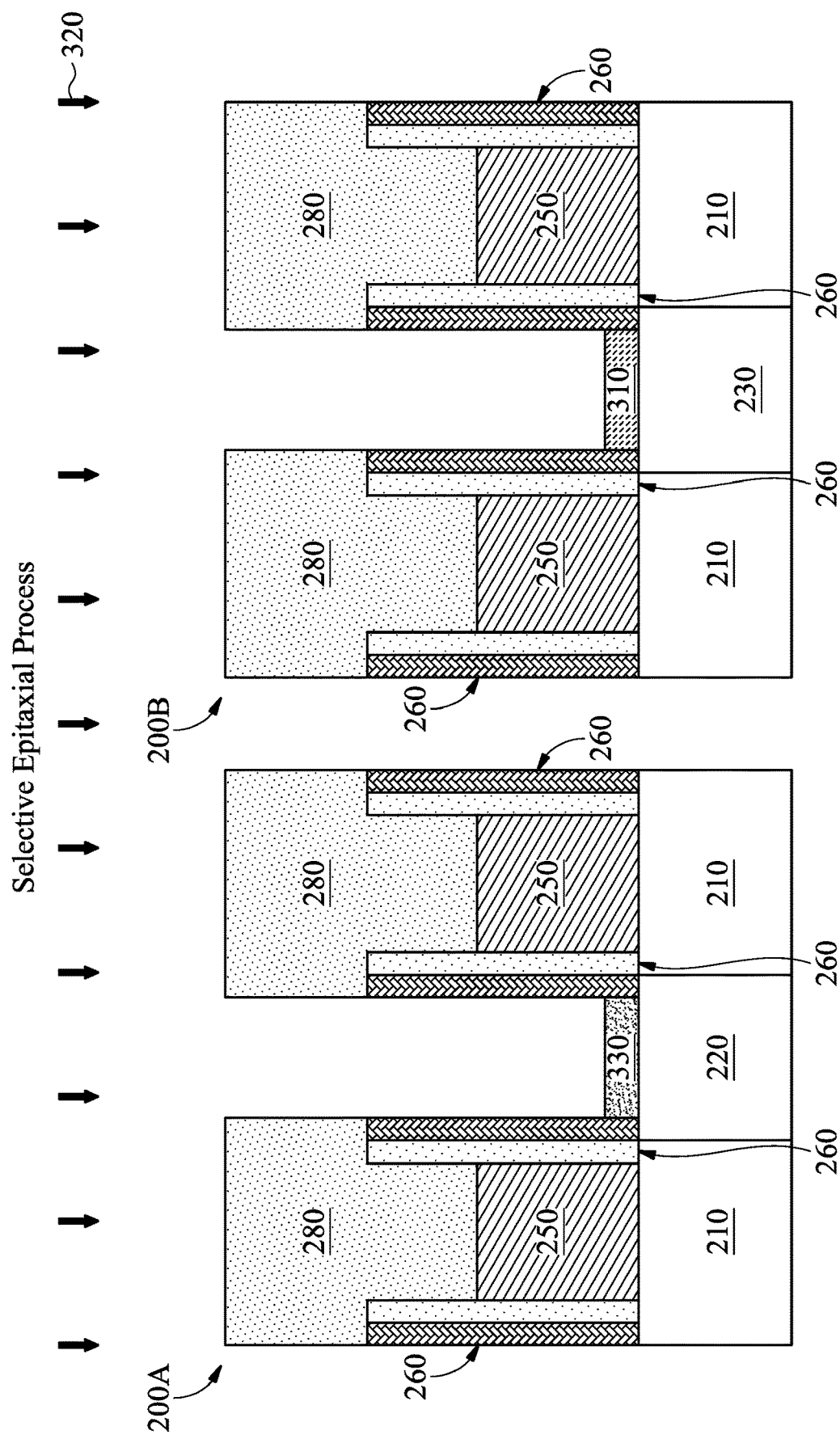

Referring now to FIG. 3, a selective epitaxial process 320 is performed to grow an epi-layer 330A over the source/drain region 220 of the NFET device 200A, but not over the source/drain region 230 of the PFET device 200B. The reason why the epi-layer 330A can be selectively formed just on the source/drain region 220 is that the dielectric layer 310 (formed over the source/drain region 230) prevents epitaxial growth. As such, no epi layer is formed for the PFET device 200B. In some embodiments, the epi-layer 330A includes SiP. It is understood that the performance of the selective epitaxial process 320 is optional. In other words, it may be performed in some embodiments but may not be performed in other embodiments.

Figure 4:
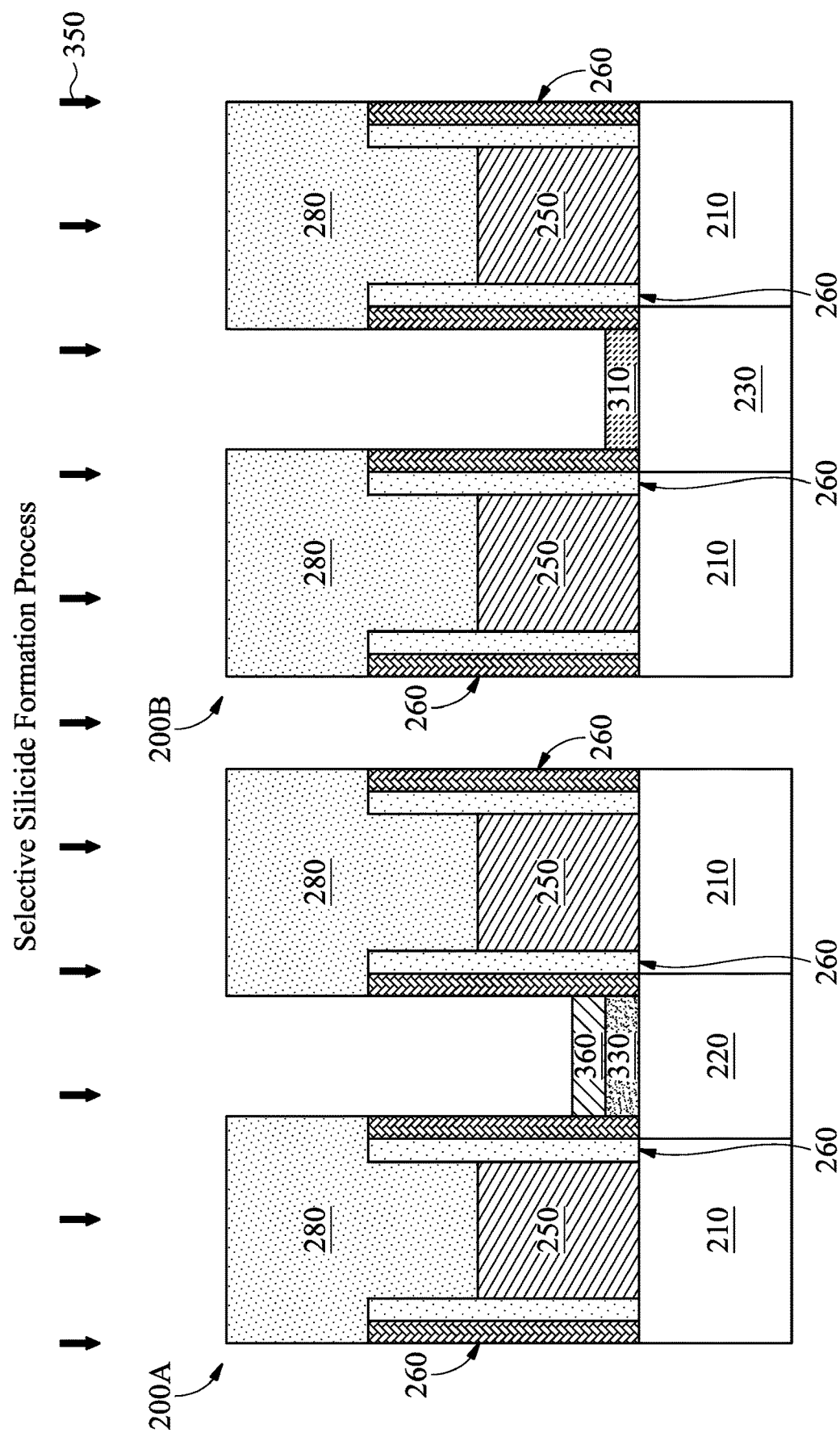

Referring now to FIG. 4, a selective silicide formation process 350 is performed to form a silicide layer 360 for the NFET device 200A but not for the PFET device 200B. In embodiments where the epi-layer 330A is optionally formed for the NFET device 200A, the silicide layer 360 is formed on the epi-layer 330A. In embodiments where the epi-layer 330A is not formed, the silicide layer 360 is formed on the source/drain region 220.

There are at least two ways of forming the silicide layer 360. According to one embodiment, the silicide layer 360 may be formed by depositing a metal material (e.g., Ti, Al, Hf, La, etc.) on the epi-layer 330A (if it has been optionally formed) or on the source/drain region 220 (if the epi-layer was not formed). In some embodiments, using $TiCl_4/H_2$, Ti can be selectively deposited on Si in a thermal CVD process or a PECVD process. In these processes, a process temperature may be in a range between about 300 degrees Celsius and about 500 degrees Celsius, a process pressure may be in a range between about 5 milli-Torr and about 5 Torr, and a flow rate may be in a range between about 1 standard cubic centimeters per minute (sccm) to about 1000 sccm. Similar deposition processes may also be used to deposit Hf, Al, or La based metals. In addition, electroplating (ECP) or electroless deposition (ELD) may also be used for selective deposition on SiP compared to SiGeB. Thereafter, an annealing process is performed to cause a reaction between the materials of the epi-layer 330A with the deposited metal (or between the source/drain region 220 and the deposited metal), thereby forming the silicide layer 360.

According to another embodiment, the silicide layer 360 may be directly deposited on the epi-layer 330A (or on the source/drain region 220 if the epi-layer 330A is not formed). This may be achieved by performing a CVD process (or another suitable deposition process) using a first precursor that includes metal (e.g., Ti) and a second precursor that includes Si (silane). In some embodiments, using $TiCl_4/SiH_4$, $TiSi_x$ can be selectively deposited on Si in a thermal CVD process or a PECVD process. In these processes, a process temperature may be in a range between about 300 degrees Celsius and about 600 degrees Celsius, a process pressure may be in a range between about 5 milli-Torr and about 5 Torr, and a flow rate may be in a range between about 1 standard cubic centimeters per minute (sccm) to about 1000 sccm. In some other embodiments, using $TiCl_4/H_2$, $TiSi_x$ can be selectively deposited on Si in a thermal CVD process or a PECVD process. In these processes, a process temperature may be in a range between about 300 degrees Celsius and about 500 degrees Celsius, a process pressure may be in a range between about 5 milli-Torr and about 5 Torr, and a flow rate may be in a range between about 1 standard cubic centimeters per minute (sccm) to about 1000 sccm. Similar deposition processes may also be used to deposit Hf, Al, or La based metals. In addition, electroplating (ECP) or electron-less deposition (ELD) may also be used for selective deposition on SiP compared to SiGeB. An annealing process may also be optionally performed, for example to change a phase of the deposited silicide layer 360.

Regardless of the method used to form the silicide layer 360, it is understood that the presence of the dielectric layer 310 prevents the formation of silicide materials for the PFET device 200B, thereby allowing the silicide layer 360 to be selectively formed just for the NFET device 200A. The material composition of the silicide layer 360 is also associated with a lower work function (e.g., compared to a work function of a silicide formed for the PFET device 200B in a later process discussed below in more detail). In various embodiments, the silicide layer 360 may include titanium silicide ($TiSi_x$), aluminum silicide ($AlSi_x$), hafnium silicide ($HfSi_x$), lithium silicide ($LiSi_x$), erbium silicide ($ErSi_x$), ytterbium silicide ($YbSi_x$), yttrium silicide ($YSi_x$), lanthanum silicide ($LaSi_x$), or combinations thereof. In some embodiments, the silicide layer 360 may have a work function that is less than about 4 electron volts (eV), for example in a range between about 2 eV and about 4 eV.

Figure 5:
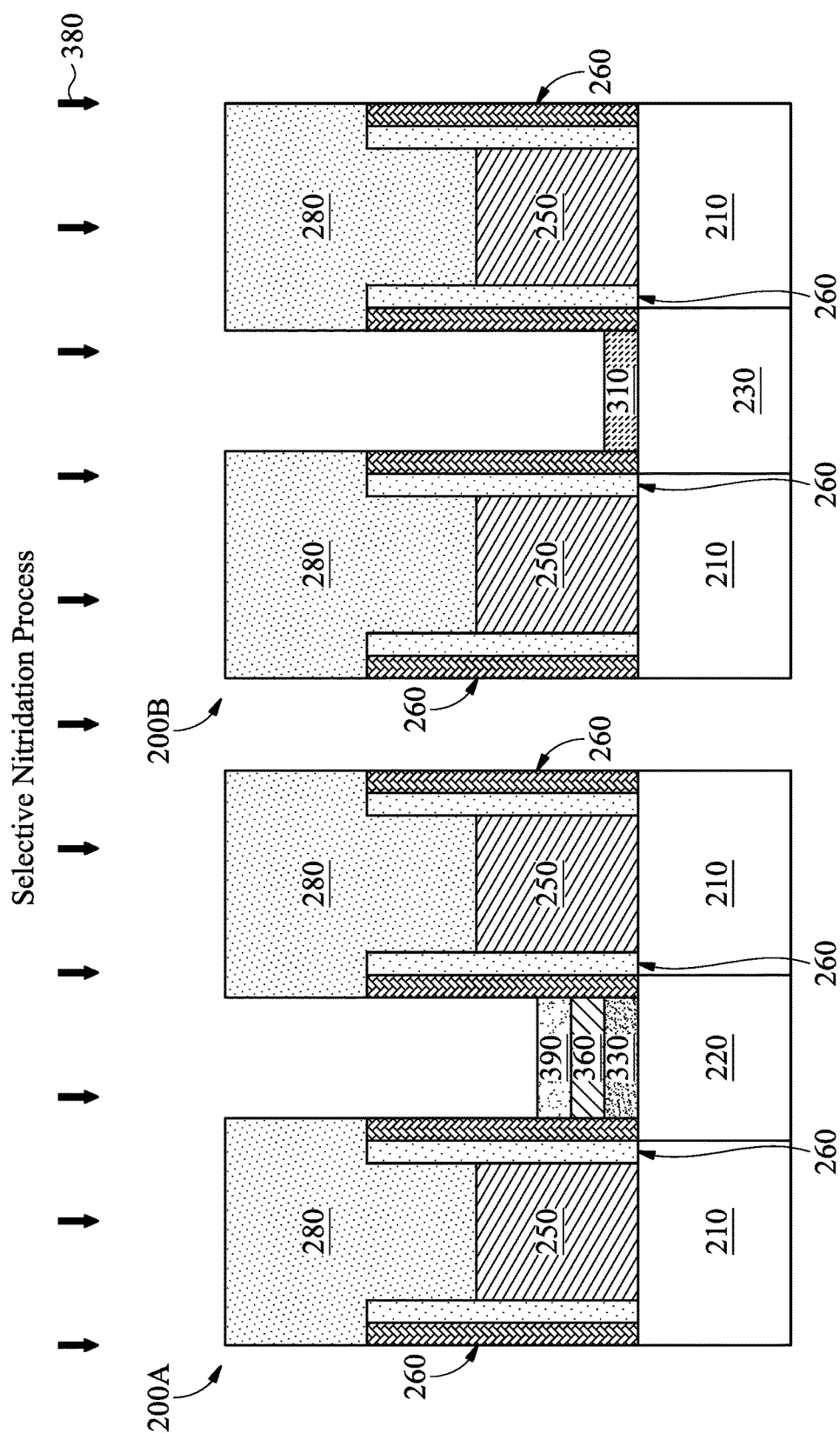

Referring now to FIG. 5, a selective nitridation process 380 is performed to form a nitride layer 390 for the NFET device 200A but not for the PFET device 200B. In some embodiments, the nitride layer 390 includes nitrided metal silicide, for example nitrided titanium silicide (TiSiN) (also referred to as titanium silicide nitride). In some embodiments, the selective nitridation process 380 may include a plasma process. For example, the wafer containing the NFET device 200A and the PFET device 200B may be placed in a chamber filled with nitrogen plasma. The nitrogen plasma nitridizes a portion of the silicide layer 360 of the NFET device 200A but does not substantially nitridize the dielectric layer 310 of the PFET device 200B, for example due to the oxide material composition of the dielectric layer 310. To the extent that a small amount of nitride material may be formed on the dielectric layer 310, it does not interfere with the intended operation or functionality of the dielectric layer 310 either, since the dielectric layer 310 (and any nitride materials formed thereon) will be removed in a later process anyway. In any case, the nitride layer 390 formed for the NFET device 200A may serve as a barrier layer to prevent or reduce diffusion of materials from a conductive contact (to be formed above the nitride layer 390) into the layers below (e.g., into the silicide layer 360).

Figure 6:
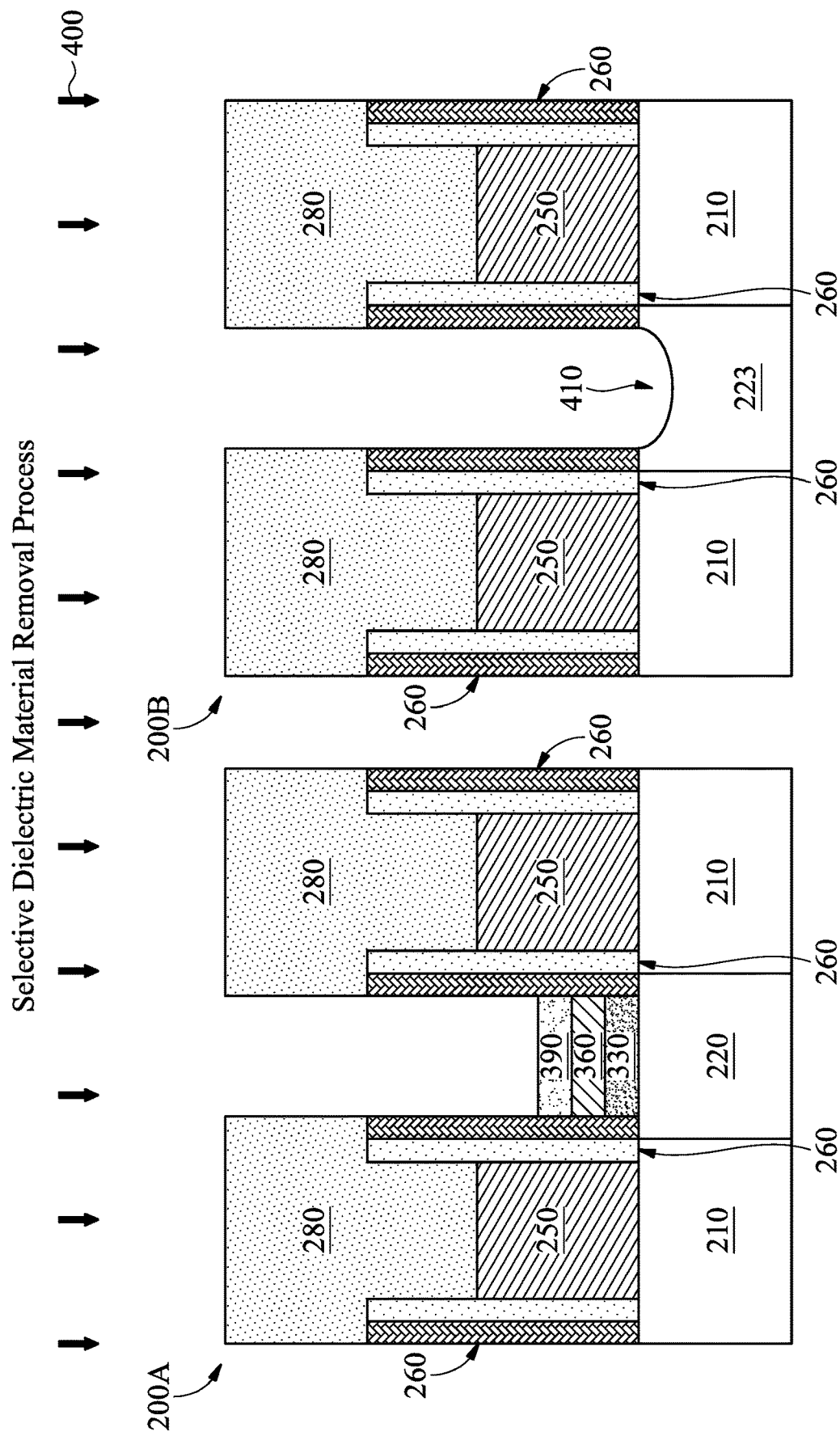

Referring now to FIG. 6, a selective dielectric material removal process 400 is performed to selectively remove the dielectric layer 310 for the PFET device 200B. The selective dielectric material removal process 400 is performed such that the dielectric layer 310 is removed without causing substantial damage to the other layers of the NFET device 200A or the PFET device 200B. In some embodiments, the selective dielectric material removal process 400 includes one or more etching processes having an etching selectivity between the material of the dielectric layer 310 and other types of materials. For example, in embodiments where the dielectric layer 310 contains oxide, the etching processes may have an etching selectivity between oxide and other materials, such that the oxide is etched away at a much greater rate (e.g., more than five times or more than ten times faster) than the other materials. In this manner, the dielectric layer 310 may be etched away without substantially affecting the other components of the NFET device 200A or the PFET device 200B.

In some embodiments, the selective dielectric material removal process 400 may cause a recess 410 to be formed for the PFET device 200B. The recess 410 is formed within the source/drain region 230, for example as a result of the etching of the dielectric layer 310. In some embodiments, the recess 410 may have a depth in a range between about 0.5 nanometers (nm) and about 3 nm. This recess 410 (and the subsequent filling therein by a conductive material) is one of the unique physical characteristics of the present disclosure. This is because the recess 410 is formed due to the etching of the dielectric layer 310, which is not formed in conventional processes. In other words, devices fabricated according to conventional processes do not have the recess 410 in the PFET device 200B because conventional processes do not form the dielectric layer 310 and therefore do not need to remove the dielectric layer 310. One benefit offered by the recess 410 is a larger contact surface area, which helps reduce resistivity.

Figure 7:
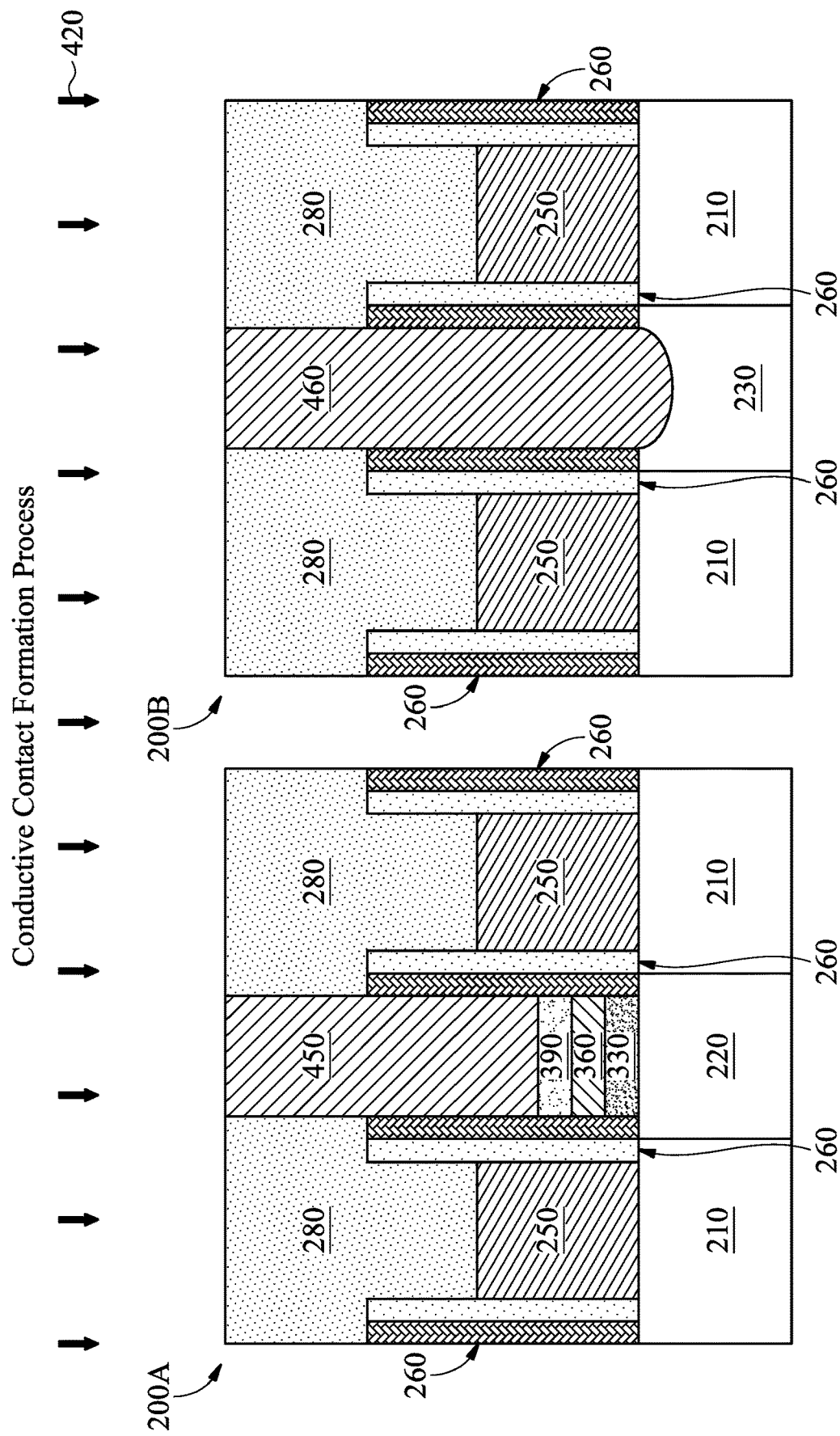

Referring now to FIG. 7, a contact formation process 420 is performed to form a conductive contact 450 for the NFET device 200A and a conductive contact 460 for the PFET device 200B. In various embodiments, the conductive material of the conductive contacts 450 and 460 may include nickel (Ni), ruthenium (Ru), tungsten (W), cobalt (Co), molybdenum (Mo), or combinations thereof. In various embodiments, the contact formation process 420 may include a metal deposition process, for example a CVD process. In some embodiments, the CVD process is performed using a process temperature in a range between about 50 degrees Celsius and about 500 degrees Celsius, a carrier gas of argon or nitrogen, and with a flow rate in a range between about 10 standard cubic centimeters per minute (sccm) and about 500 sccm. In other embodiments, the metal deposition process may include ALD, electroplating (ECP), electron-less deposition (ELD), or a reflow process.

In some embodiments, the metal deposition is selective such that it is deposited on the source/drain region 230 and on the nitride layer 390, but not on the ILD 280. This helps with the trench filling performance, as well as obviating the need to perform a polishing process such as chemical mechanical polishing (CMP) process to remove the metal material deposited on the ILD 280. The selective deposition may be achieved by configuring the process parameters. For example, if Ru is used as the metal material for the conductive contacts, $Ru(hfac)_2(CO)_2$ may be used for the deposition, which allows the Ru to be selectively deposited on the source/drain region 230 and on the nitride layer 390 but not on the ILD 280. Alternatively, the Ru may be grown as a Ru film on metal materials and/or silicon, but not on oxides. This may be done by using Hexadiene-based Ru precursors with $O_2$, which may be done at a temperature between about 100 degrees Celsius and about 200 degrees Celsius. As another example, if W is used for the metal material of the conductive contacts 450 and 460, it may be selectively deposited using process gases such as $WF_6/H_2$ or $WF_6/H_2/SiH_4$. The temperature may be in a range between about 250 degrees Celsius and about 500 degrees Celsius, and the pressure may be in a range between about 5 mTorr and about 5 Torr, and the flow rate may be in a range between about 1 standard cubic centimeter per minute (sccm) to about 1000 sccm. As a further example, if Co is used for the metal material of the conductive contacts 450 and 460, $Co(tBu-DAD)_2$ may be used for the deposition.

In other embodiments, however, the contact formation process 420 may not be selective, and thus the ILD 280 may have metal materials deposited thereon, which may be removed by a CMP process performed later.

Regardless of whether the contact formation process 420 is selective, it can be seen that the conductive contact 460 is formed to fill in the recess 410 in the source/drain region 230. Thus, the conductive contact 460 of the PFET device 200B has a protrusion into the source/drain region 230. As discussed above, this protrusion is one of the unique physical characteristics of the present disclosure. Compared to conventional devices, the conductive contact 460 also has a larger surface contact area with the source/drain region 230, which helps reduce resistivity.

The conductive contacts 450 and 460 are formed to have a conductive material (e.g., such as a metal material) with low electrical resistivity and a high work function. In some embodiments, the work function if the conductive material of the conductive contacts 450 and 460 may be greater than about 4 eV, for example greater than about 4.25 eV.

The high work function property of the conductive material ensures that the subsequently formed metal silicide for the PFET device 200B will have a higher work function than the silicide layer 360 for the NFET device 200A, which has already been formed and has a lower work function. As discussed above, since the conductive contact 450 is formed on the nitride layer 390—instead of being formed directly on the silicide layer 360—the present disclosure alleviates the concern of diffusion of the high work function materials from the conductive contact 450 into the silicide layer 360.

Figure 8:
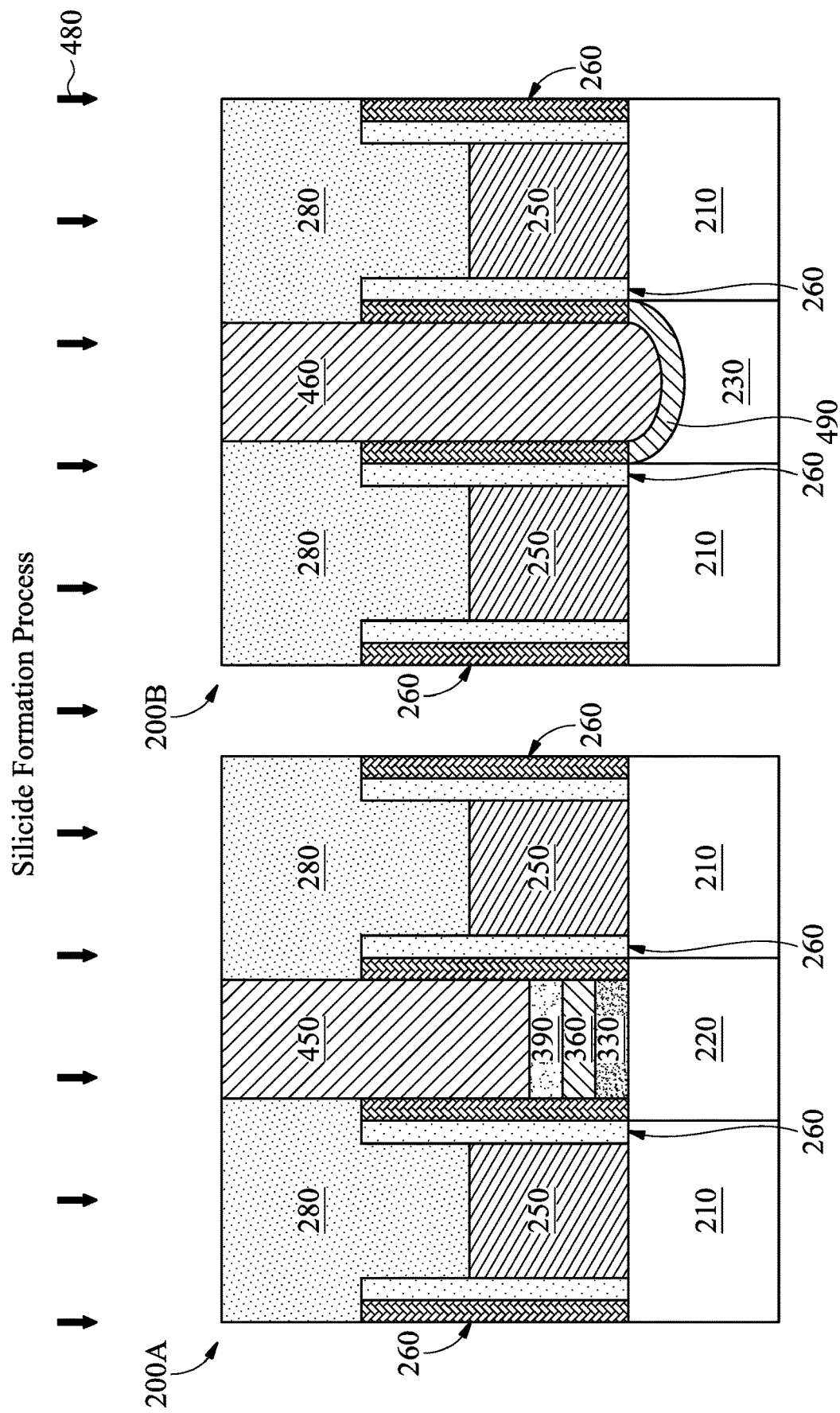

Referring now to FIG. 8, a silicide formation process 480 is performed to form a silicide layer 490 for the PFET device 200B. In some embodiments, the silicide formation process 480 includes a thermal process such as an annealing process, in which the conductive materials of the conductive contact 460 react with the semiconductive materials below (e.g., the source/drain region 230) to form the silicide layer 490. The resulting silicide layer 490 may include tungsten silicide ($WSi_x$), molybdenum silicide ($MoSi_x$), ruthenium silicide ($RuSi_x$), nickel silicide ($NiSi_x$), or cobalt silicide ($CoSi_x$). Due to the differences in their respective material compositions, the silicide layer 490 for the PFET device 200B has a higher work function than the silicide layer 360 for the NFET device 200A. As discussed above, this helps to optimize device performance, for example with respect to reduction in contact resistivity.

In some alternative embodiments, the silicide for the PFET device 200B may be formed by a direct deposition process. For example, referring now to FIG. 9, a silicide deposition process 500 is performed to deposit a silicide layer 510 in the recess 410 over the source/drain region 230 of the PFET device 200B. In some embodiments, the direct deposition may include performing a CVD process (or another suitable deposition process) using a first precursor that includes metal (e.g., W, Co, Ni, Ru, or Mo) and a second precursor that includes Si (silane). An annealing process may also be optionally performed, for example to change a phase of the deposited silicide layer 510. Note that the silicide deposition process 500 may also form a silicide layer 520 over the nitride layer 390 for the NFET device 200A. In some embodiments, direct deposition may be done selectively such that the metal silicide layer 510 is deposited on the PFET device 200B but not for the NFET device 200A (e.g., no silicide layer 520 will be formed for the NFET device 200A). In some embodiments, the direction metal silicide deposition on the PFET device 200B may be done by using Ru(hfac)2(CO)2 for deposition on Si, but not on oxide. In some embodiments, Hexadiene-based Ru precursors with $O_2$ may be used for selective deposition on SiGeB. In some embodiments, a surface selective film growth process may be performed, for example, using Ru3(CO)12, surface selective ruthenium film growth at 100-200 degrees Celsius may be done on metals and Si but not on oxides. In some embodiments, W can be selectively deposited on Si or metal surfaces, using process gases such as $WF_6/H_2$ or $WF_6/H_2/SiH_4$, a process temperature range between about 250 to about 500 degrees Celsius, a process pressure range between about 5 mTorr and about 5 Torr, and a flow rate between about 1 sccm and about 1000 sccm. In some embodiments, silicides such as $WSi_x$ can be selectively deposited on Si or metal surfaces using process gases such as $WF_6/SiH_2Cl_2$ or $WF_6/SiH_4$ or $WF_6/SiHCl_3$, a process temperature range between about 350 to about 600 degrees Celsius, a process pressure range between about 5 mTorr and about 5 Torr, and a flow rate between about 1 sccm and about 1000 sccm. In some embodiments, Mo may be selectively deposited using $Mo(Cl)_x$ in the presence of $H_2$, using a process temperature range between about 350 to about 600 degrees Celsius, a process pressure range between about 5 mTorr and about 5 Torr, and a flow rate between about 1 sccm and about 1000 sccm. In some embodiments, Co may be selectively deposited by CVD and/or ALD using $Co_2(CO)_6[HCC(C(CH_3)3)]$ or Amido based precursors or by ECP and/or ELD. Co(tBuDAD)2 may also be used to selectively deposit on Si but not on $SiO_2$. $CoCp(CO)_2$ may be used with $SiH_4$ or $H_2$ for selective deposition on Si but not on $SiO_2$. In some embodiments, selective deposition of Ni may be done using CVD or ECP and/or ELD processes. Ta or Ta silicide may also be selectively deposited using $Ta(Cl)_x$ in the presence of $H_2$ or $SiH_4$.

Figure 9:
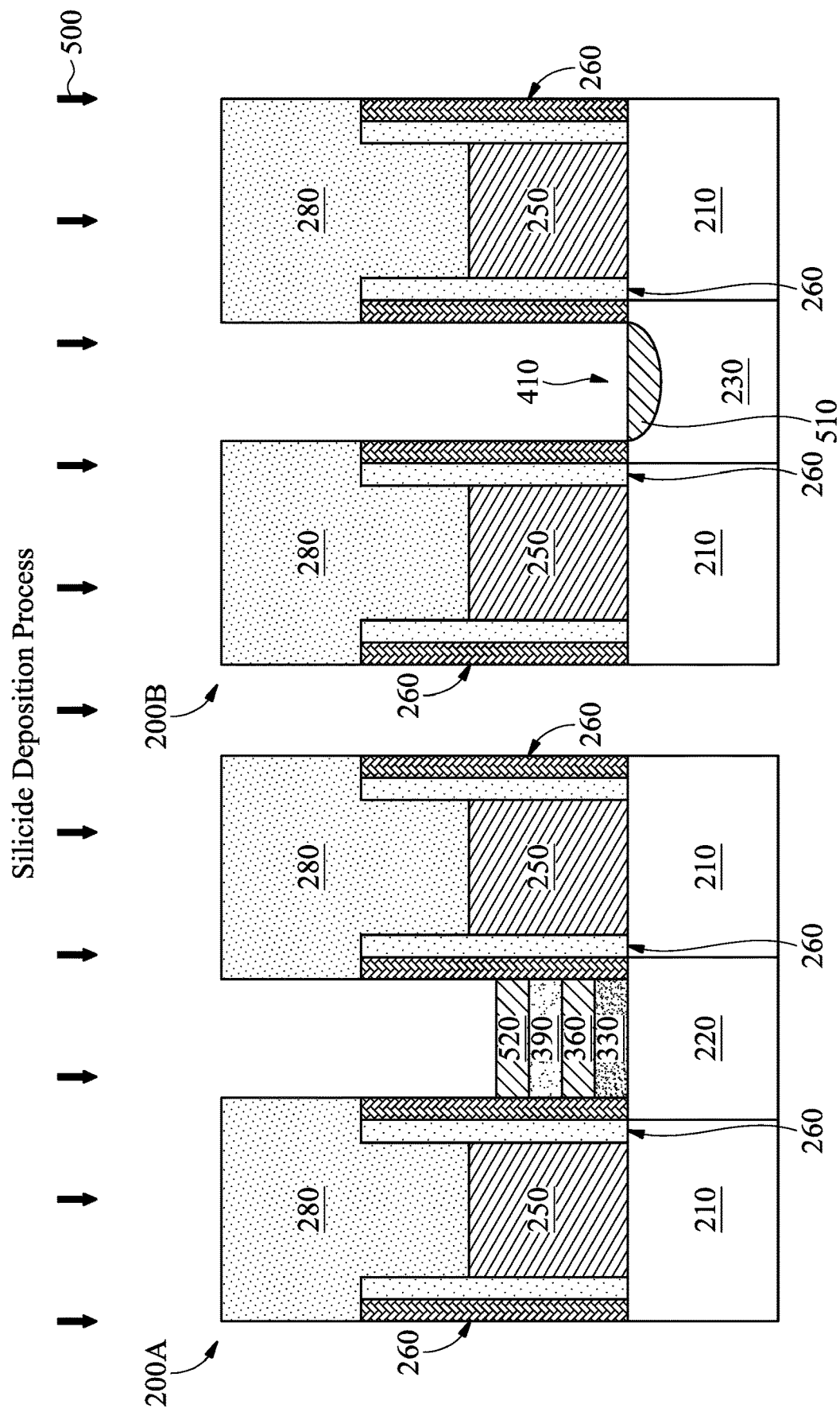
Figure 10:
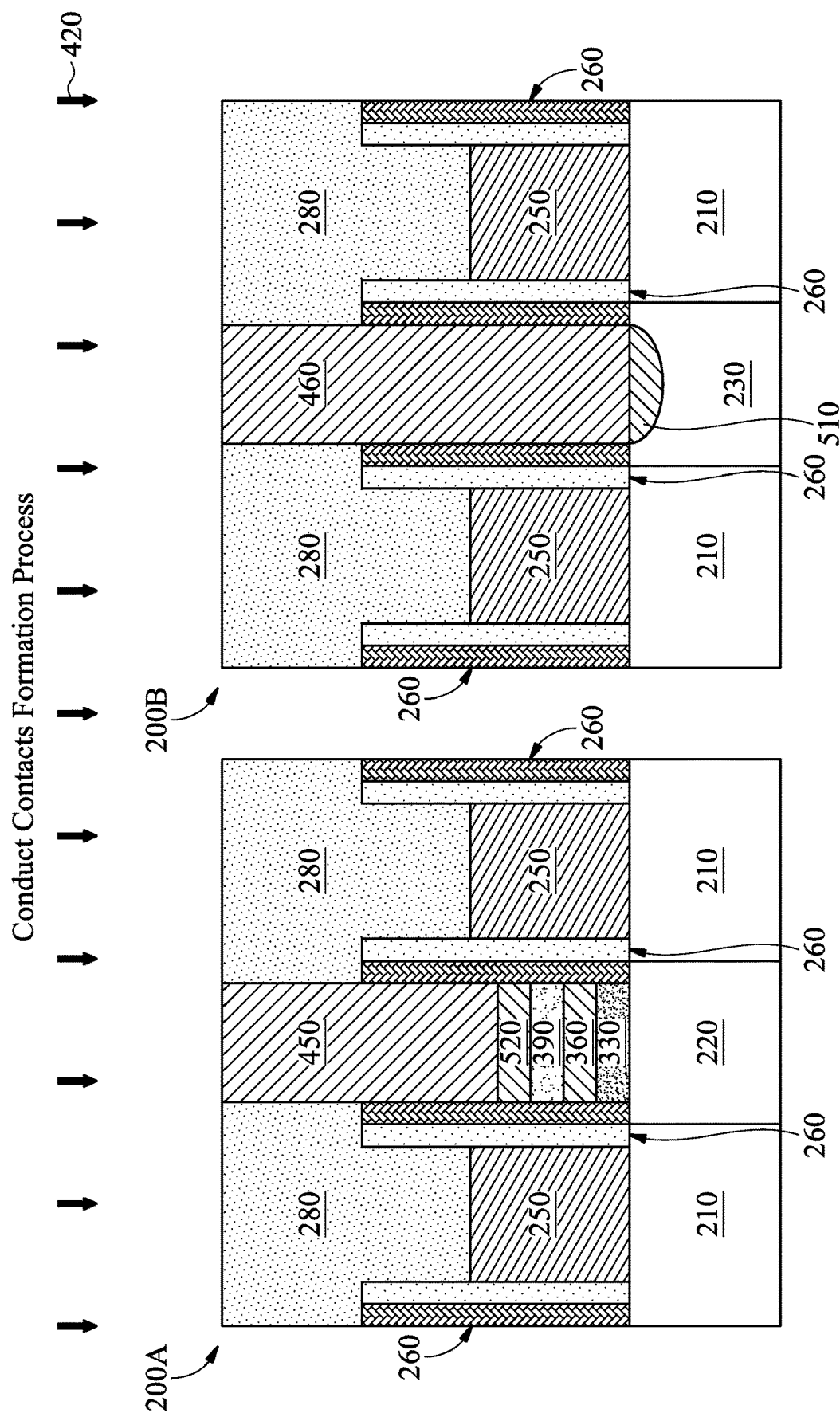

Referring now to FIG. 10, according to the alternative embodiment of FIG. 9, after the performance of the silicide deposition process 500, the conductive contacts 450 and 460 may be formed over the silicide layer 520 and the silicide layer 510, respectively. Note that in the embodiment shown in FIG. 10, the silicide layer 510 for the PFET device 200B also has a higher work function than the silicide layer 360 for the NFET device 200A. As such, the alternative embodiment shown in FIG. 10 also facilitates the reduction in contact resistivity. Both the embodiment in FIG. 8 and the embodiment in FIG. 10 are formed by a plurality of selective processes and without complicated lithography patterning steps. Thus, the embodiments of the present disclosure are efficient and cost effective. In addition, in some embodiments, the conductive contacts 450 and 460 can be formed without using barrier layers that surround them. In other words, the conductive contacts 450 and 460 may be formed by barrier-less deposition, which also helps reduce contact resistivity.

As a result of the unique fabrication processes discussed above, a distinct physical characteristic that is common to both embodiments of FIG. 8 and FIG. 10 is that the NFET device 200A and the PFET device 200B not only have different silicide material compositions, but also different arrangements and/or geometric shapes for their silicide layers. For example, as discussed above, due to the removal of the dielectric layer 310 formed over the PFET device 200B, the silicide layer 490 or 510 of the PFET device 200B may protrude downwardly into the source/drain region 230 of the PFET device 200B. In comparison, the silicide layer 360 of the NFET device 200A does not exhibit a protrusion into the source/drain 220, or if anything, a slight protrusion that is much less than that of the silicide layer 490 or 510. In other words, the silicide layers for the NFET device 200A and the PFET device 200B are asymmetrical in their geometrical shape or profile. Another characteristic of the asymmetry between the silicide layer 360 and the silicide layer 490/510 is that the silicide layer 360 has a more elevated position vertically. For example, a bottom surface of the silicide layer 360 has a more elevated position vertically than a bottom surface of the silicide layer 490/510. In some embodiments, the bottom surface of the silicide layer 360 has a more elevated position vertically than even a top surface of the silicide layer 490/510.

In addition, the NFET device 200A may also include a nitride layer 390 (or even another silicide layer 520) disposed between its silicide layer 360 and the conductive contact 450, whereas the PFET device 200B does not include such a nitride layer or an extra silicide layer—which has a different material composition than the silicide layer 490/510—between the silicide layer 490/510 and the conductive contact 460. Due to the extra components of the NFET device 200A, the conductive contact 450 of the NFET device 200A has a shallower depth (e.g., vertical dimension measured in the Z-direction) than the conductive contact 460 of the PFET device 200B.

FIGS. 2-10 correspond to a process flow in which the metal silicide for the NFET device 200A is formed before the metal silicide for the PFET device 200B is formed. FIGS. 11-17 correspond to a different process flow in which the metal silicide for the PFET device 200B is formed before the metal silicide for the NFET device 200A is formed.

Figure 11:
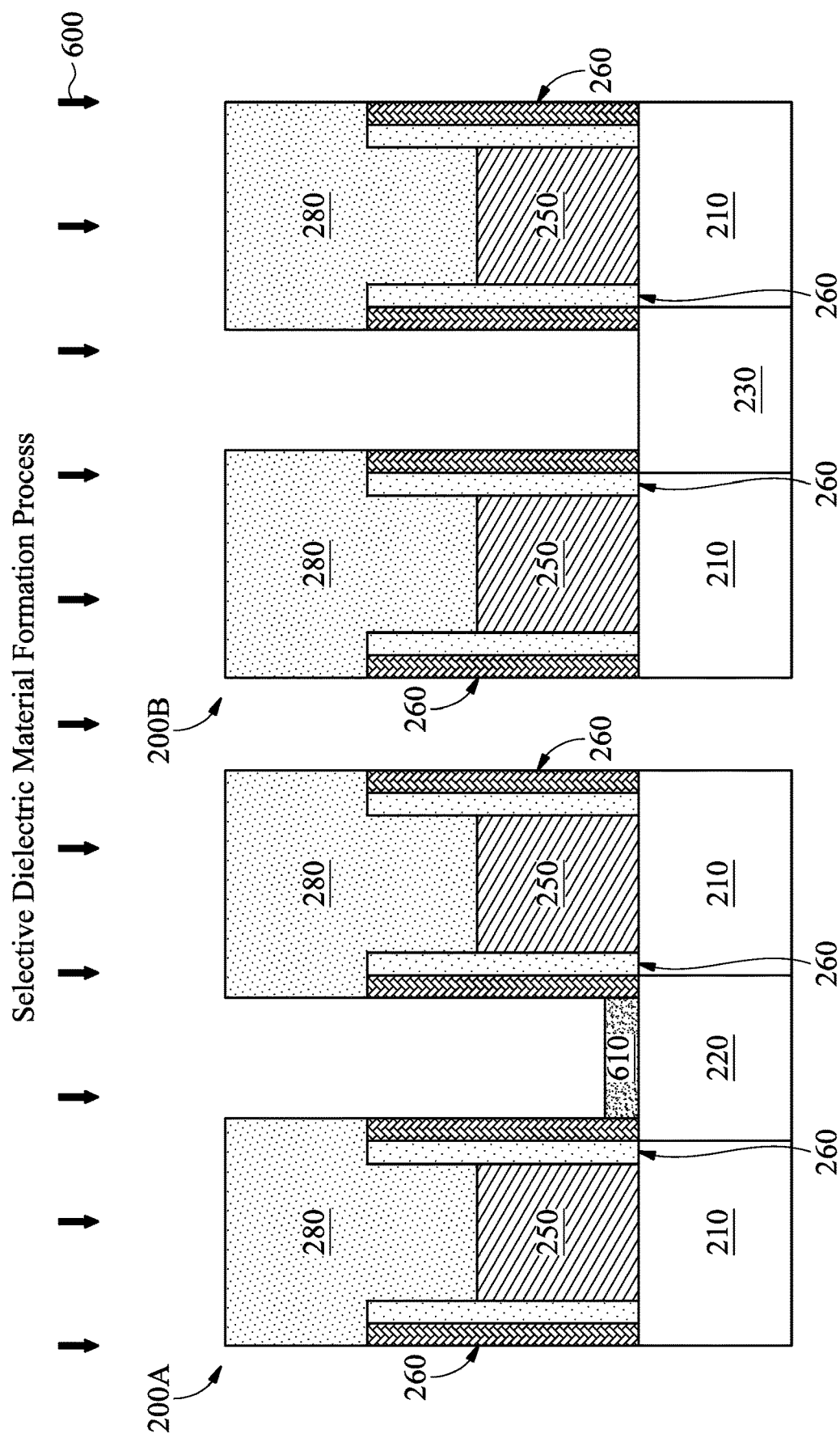

Referring now to FIG. 11, a selective dielectric material formation process 600 is performed to selectively form a dielectric layer 610 over the source/drain region 220 of the NFET device 200A, but not over the source/drain region 230 of the PFET device 200B. In some embodiments, the selective dielectric material formation process 600 includes a process that oxidizes the semiconductive materials of the source/drain region 220, but not the semiconductive materials of the source/drain region 230. For example, in embodiments where the source/drain region 220 contains SiP but the source/drain region 230 contains boron-doped SiGe, due to the different properties of phosphorous and germanium, the process parameters (e.g., pressure, temperature, gas flow rates, etc.) of the selective dielectric material formation process 600 may be configured such that the phosphorous content gets oxidized, but not the germanium content. Consequently, the dielectric layer 610 may be formed over the source/drain region 220 but not over the source/drain region 230. In some embodiments, $SiO_2$ or metal oxides like $HfO_2$, $ZrO_2$, $TiO_2$, etc. may be capped during N-epi growth or P-epi growth. The structure will have oxide on SiP but not on P-epi or vice versa. In some other embodiments, using low to medium temperature oxidation in high-purity oxygen or wet oxidation, different oxides may be grown on SiGe or Ge compared to SiP. In yet other embodiments, using selective CVD or ALD processes, oxide may be deposited on SiP or SiGe.

In other embodiments, the selective dielectric material formation process 600 may include a direct deposition of the dielectric layer 610. For example, the dielectric layer 610 is directly deposited on the source/drain region 220 using a deposition process such as CVD or ALD, but not on the source/drain region 230. This selective deposition may be achieved by configuring the deposition process to have more selectivity with SiP than with SiGe, for example.

Regardless of the embodiment used to form the dielectric layer 610, the selective dielectric material formation process 600 does not need lithography masks to achieve the selective formation of the dielectric layer 610, which simplifies fabrication. In some embodiments, the dielectric layer 610 is formed to have an oxide material composition such as silicon phosphorous oxide or another suitable metal oxide. In other embodiments, the dielectric layer 610 may be formed to have a nitride material composition instead. Similar to the dielectric layer 310, one role of the dielectric layer 610 is to prevent the formation of metal silicide for the NFET device 200A when the metal silicide is formed for the PFET device 200B.

Figure 12:
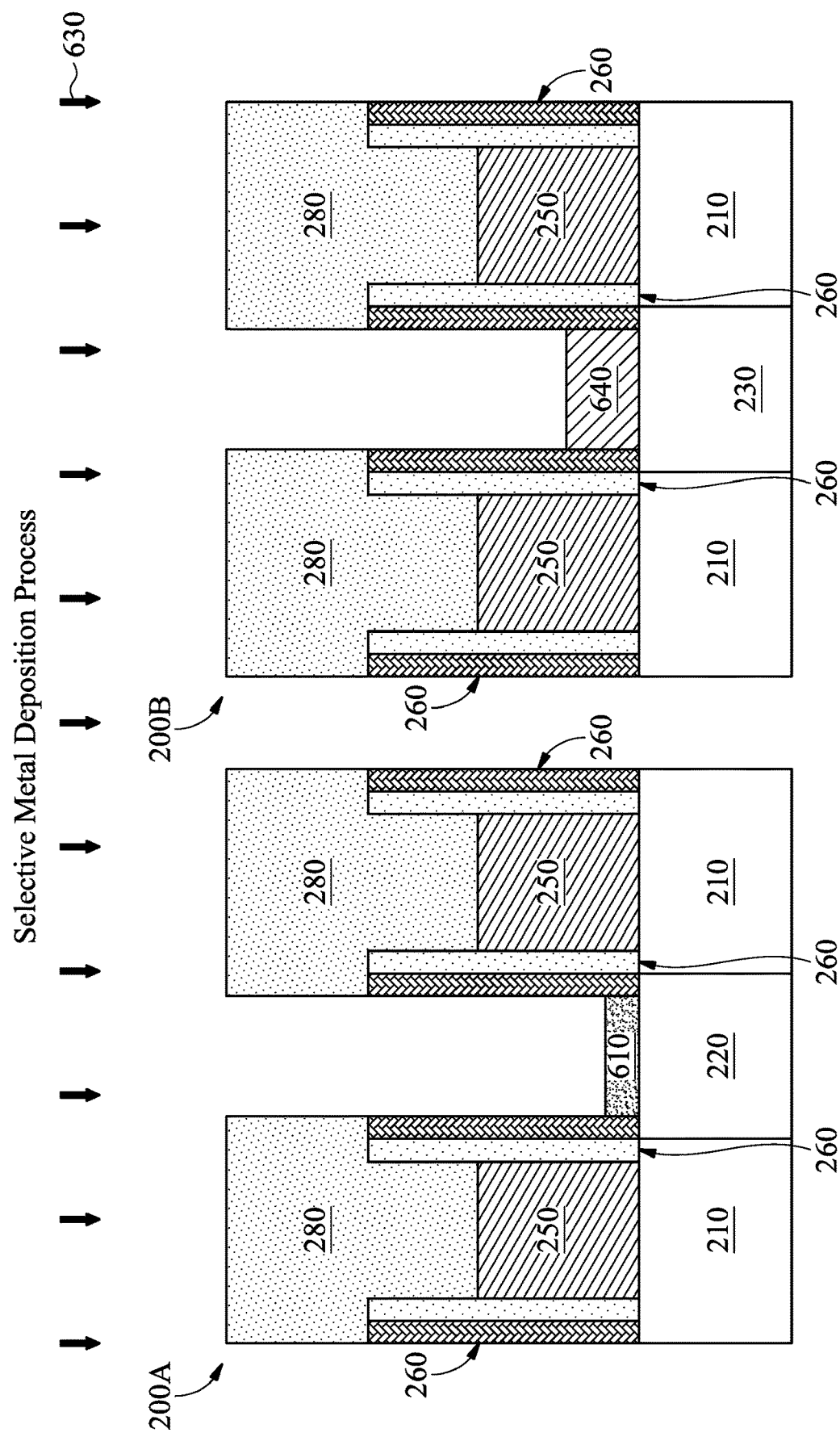

Referring now to FIG. 12, a selective metal deposition process 630 is performed to selectively form a metal material 640 over the source/drain region 230 of the PFET device 200B, but not over the dielectric layer 610 of the NFET device 200A. The metal deposition process may include CVD, ALD, ECP, ELD, or a reflow process. In some embodiments, the metal deposition is selective such that it is deposited on the source/drain region 230 but not on the dielectric layer 610 or on the ILD 280. This helps with the trench filling performance. In some embodiments, the metal material 640 includes a p-type metal such as Ru, W, Co, Ni, or Mo. In some embodiments, Ru(hfac)2(CO)2 may be used for selective deposition on Si, but not on oxide. In some embodiments, Hexadiene-based Ru precursors with $O_2$ may be used for selective deposition on SiGeB. In some embodiments, a surface selective film growth process may be performed, for example, using Ru3(CO)12, surface selective ruthenium film growth at 100-200 degrees Celsius may be done on metals and Si but not on oxides. In some embodiments, W can be selectively deposited on Si or metal surfaces, using process gases such as $WF_6/H_2$ or $WF_6/H_2/SiH_4$, a process temperature range between about 250 to about 500 degrees Celsius, a process pressure range between about 5 mTorr and about 5 Torr, and a flow rate between about 1 sccm and about 1000 sccm. In some embodiments, silicides such as $WSi_x$ can be selectively deposited on Si or metal surfaces using process gases such as $WF_6/SiH_2Cl_2$ or $WF_6/SiH_4$ or $WF_6/SiHCl_3$, a process temperature range between about 350 to about 600 degrees Celsius, a process pressure range between about 5 mTorr and about 5 Torr, and a flow rate between about 1 sccm and about 1000 sccm. In some embodiments, Mo may be selectively deposited using $Mo(Cl)_x$ in the presence of $H_2$, using a process temperature range between about 350 to about 600 degrees Celsius, a process pressure range between about 5 mTorr and about 5 Torr, and a flow rate between about 1 sccm and about 1000 sccm. In some embodiments, Co may be selectively deposited by CVD and/or ALD using $Co_2(CO)_6[HCC(C(CH_3)3)]$ or Amido based precursors or by ECP and/or ELD. Co(t-BuDAD)2 may also be used to selectively deposit on Si but not on $SiO_2$. $CoCp(CO)_2$ may be used with $SiH_4$ or $H_2$ for selective deposition on Si but not on $SiO_2$. In some embodiments, selective deposition of Ni may be done using CVD or ECP and/or ELD processes. Ta or Ta silicide may also be selectively deposited using $Ta(Cl)_x$ in the presence of $H_2$ or $SiH_4$. Similar to how the dielectric layer 310 facilitates the selective epitaxial process 320 and the selective silicide formation process 350, the dielectric layer 610 facilitates the selective metal deposition process 630.

Figure 13:
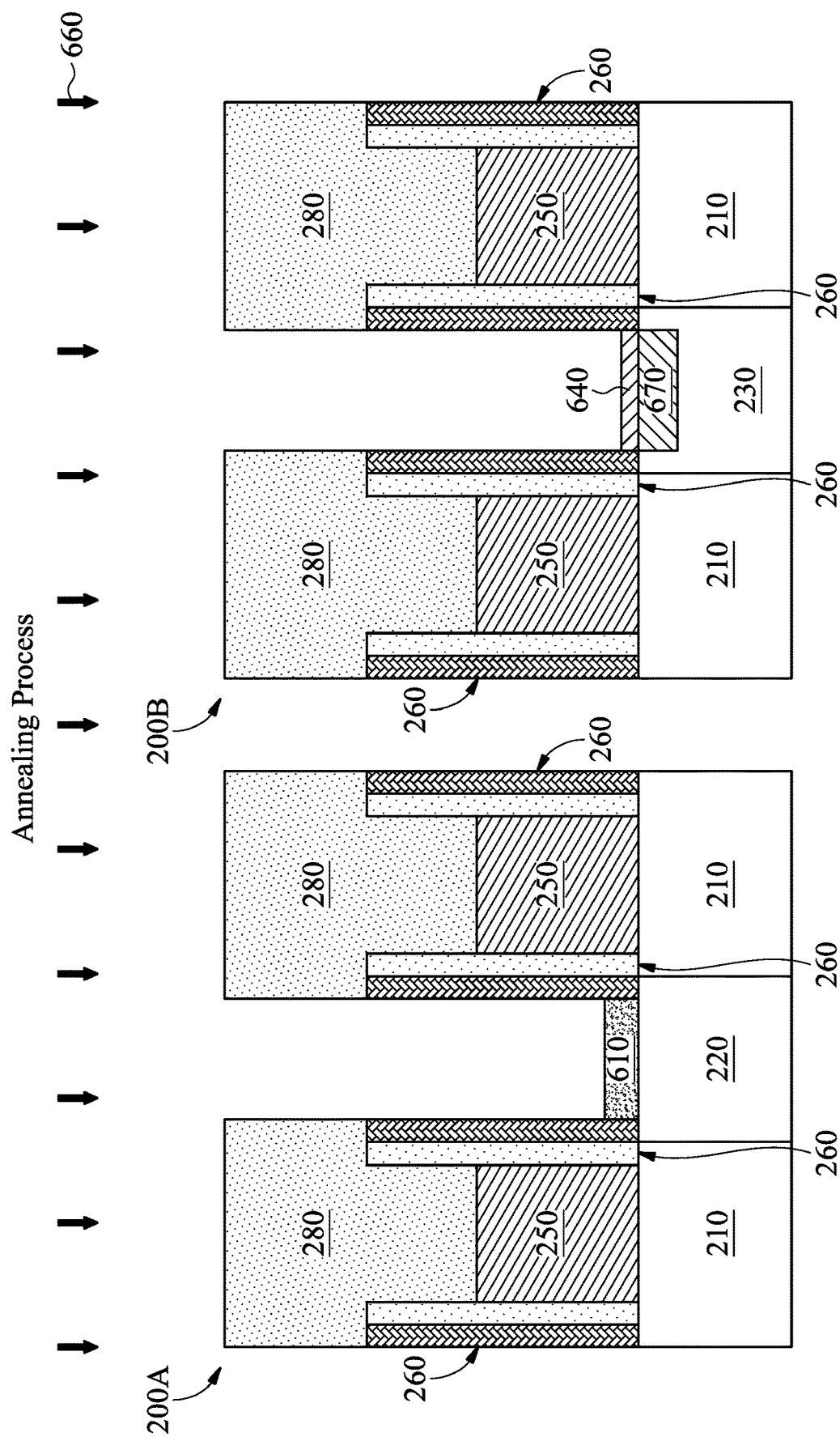

Referring now to FIG. 13, an annealing process 660 is performed to cause a reaction between the metal material 640 with the source/drain region 230, thereby forming a silicide layer 670 in the source/drain region 230 for the PFET device 200B. The silicide layer 670 may have a high work function, such as tungsten silicide ($WSi_x$), molybdenum silicide ($MoSi_x$), ruthenium silicide ($RuSi_x$), nickel silicide ($NiSi_x$), or cobalt silicide ($CoSi_x$). Note that some unreacted portions of the metal material 640 may still remain after the silicide layer 670 has been performed. Again, the presence of the dielectric layer 610 prevents the formation of the silicide layer for the NFET device 200A, since no metal material was formed over the source/drain region 220 in the first place.

Figure 14:
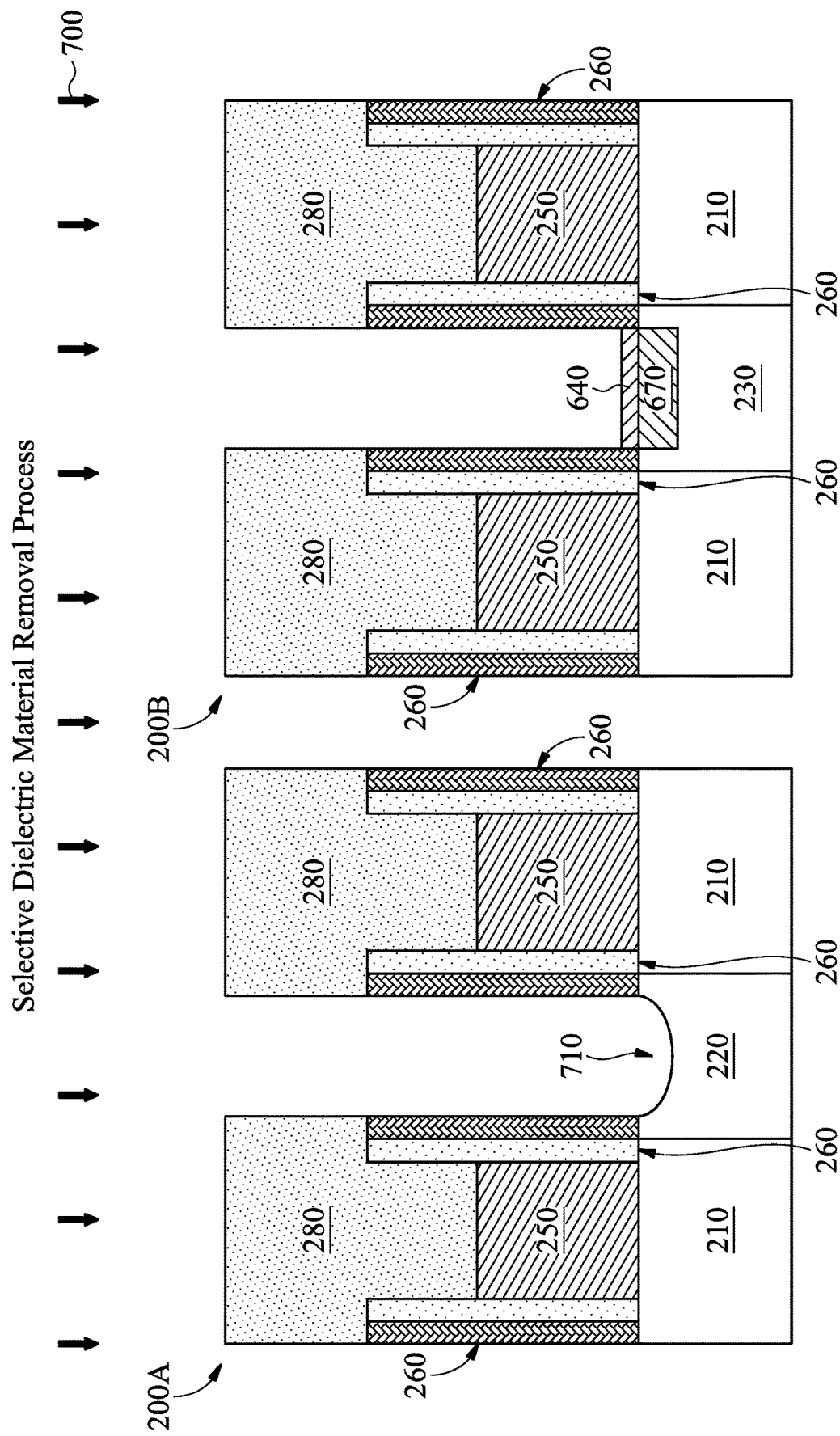

Referring now to FIG. 14, a selective dielectric material removal process 700 is performed to selectively remove the dielectric layer 610 for the NFET device 200A. The selective dielectric material removal process 700 is performed such that the dielectric layer 610 is removed without causing substantial damage to the other layers of the NFET device 200A or the PFET device 200B. In some embodiments, similar to the selective dielectric material removal process 400 discussed above, the selective dielectric material removal process 700 includes one or more etching processes having an etching selectivity between the material (e.g., oxide) of the dielectric layer 610 and other types of materials. In this manner, the dielectric layer 610 may be etched away without substantially affecting the other components of the NFET device 200A or the PFET device 200B. It is understood that although the selective dielectric material removal process 700 is shown as being performed after the annealing process 660, this order or sequence is not intended to be limiting. In other words, in some other embodiments, the selective dielectric material removal process 700 may be performed before the annealing process 660.

In some embodiments, the selective dielectric material removal process 700 may cause a recess 710 to be formed for the NFET device 200A, similar to how the recess 410 is formed in the source/drain region 230 for the PFET device 200B in the embodiment discussed above with reference to FIGS. 2-10. The recess 710 is formed within the source/drain region 220, for example as a result of the etching of the dielectric layer 610. In some embodiments, the recess 710 may have a depth in a range between about 0.5 nanometers (nm) and about 3 nm. Similar to the recess 410 shown in FIG. 6, the recess 710 (and the subsequent filling therein by a conductive material) is one of the unique physical characteristics of the present disclosure. This is because the recess 710 is formed due to the etching of the dielectric layer 610, which is not formed in conventional processes. In other words, conventional processes do not have the recess 710 in the NFET device 200A because conventional processes do not form the dielectric layer 610 and therefore do not need to remove the dielectric layer 610.

Figure 15:
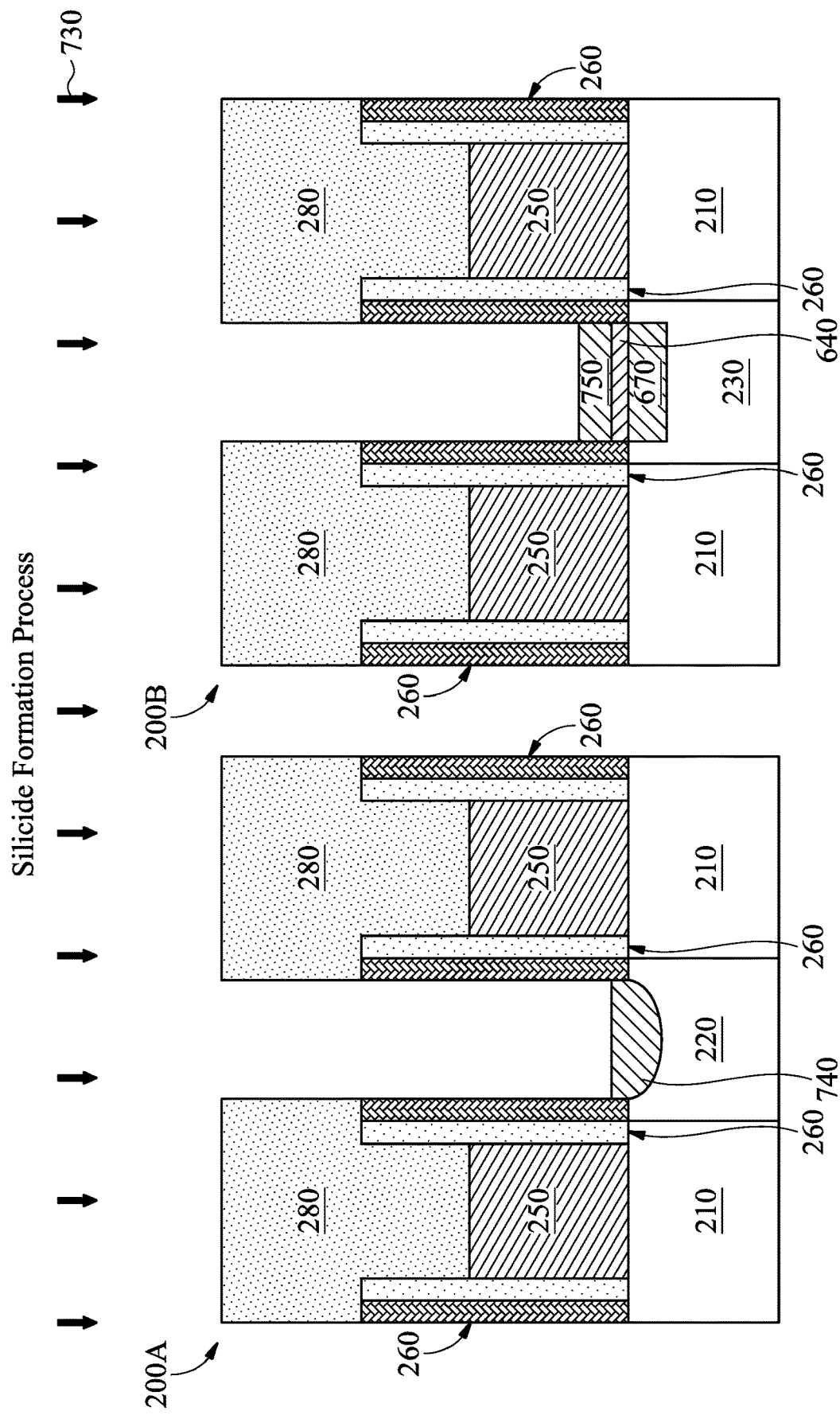

Referring now to FIG. 15, a silicide formation process 730 is performed to form a silicide layer 740 for the NFET device 200A. In some embodiments, the silicide formation process 730 includes depositing an n-type metal material over the source/drain region 220 of the NFET device 200A—where the n-type metal material would fill the recess 710—and subsequently performing an annealing process to cause a reaction between the n-type metal material and the source/drain region 220. The resulting material is the silicide layer 740.

In other embodiments, the silicide formation process 730 may include a direct deposition process, in which the silicide layer 740 is directly deposited on the source/drain region 220 (and filling the recess 710). The direct deposition may be achieved by performing a CVD process (or another suitable deposition process) using a first precursor that includes metal (e.g., Ti) and a second precursor that includes Si (silane). In some embodiments, using $TiCl_4/SiH_4$ $TiSi_x$ can be selectively deposited on Si in a thermal CVD process or a PECVD process. In these processes, a process temperature may be in a range between about 300 degrees Celsius and about 600 degrees Celsius, a process pressure may be in a range between about 5 milli-Torr and about 5 Torr, and a flow rate may be in a range between about 1 standard cubic centimeters per minute (sccm) to about 1000 sccm. In some other embodiments, using $TiCl_4/H_2$, Ti or $TiSi_x$ can be selectively deposited on Si in a thermal CVD process or a PECVD process. In these processes, a process temperature may be in a range between about 300 degrees Celsius and about 500 degrees Celsius, a process pressure may be in a range between about 5 milli-Torr and about 5 Torr, and a flow rate may be in a range between about 1 standard cubic centimeters per minute (sccm) to about 1000 sccm. An annealing process may also be optionally performed, for example to change a phase of the deposited silicide layer 740.

Regardless of how the silicide layer 740 is formed, its work function is smaller than the work function of the silicide layer 670. In some embodiments, the silicide layer 740 may include titanium silicide ($TiSi_x$), aluminum silicide ($AlSi_x$), hafnium silicide ($HfSi_x$), lithium silicide ($LiSi_x$), erbium silicide ($ErSi_x$), ytterbium silicide ($YbSi_x$), yttrium silicide ($YSi_x$), lanthanum silicide ($LaSi_x$), or combinations thereof. As discussed above, the greater work function of the silicide layer of the PFET device 200B helps to optimize device performance, for example with respect to reduction in contact resistivity. In addition, the shape of the recess 710 allows the silicide layer 740 to have a larger surface contact area with the source/drain region 220, which further reduces resistivity.

It is also understood that, in some embodiments, the silicide formation process 730 may cause a layer 750 to be formed over the metal material 640 of the PFET device 200B. In embodiments where the silicide layer 740 is formed by depositing an n-type metal material and causing the n-type metal material to react with the source/drain region 220 via an annealing process, the layer 750 includes the deposited metal material. In embodiments where the silicide layer 740 is formed by direct deposition, the layer 750 includes the metal silicide with the lower work function such as $TiSi_x$. In other words, the silicide formation process 730 may or may not be selective (e.g., forming silicide for the NFET device 200A but not for the PFET device 200B V.S. forming silicide for both the NFET device 200A and the PFET device 200B). This is because even if layer 750 is formed for the PFET device 200B, it will not substantially interfere with the operation of the PFET device 200B, since the subsequently formed conductive contact for the PFET device 200B may render the layer 750 moot.

Figure 16:
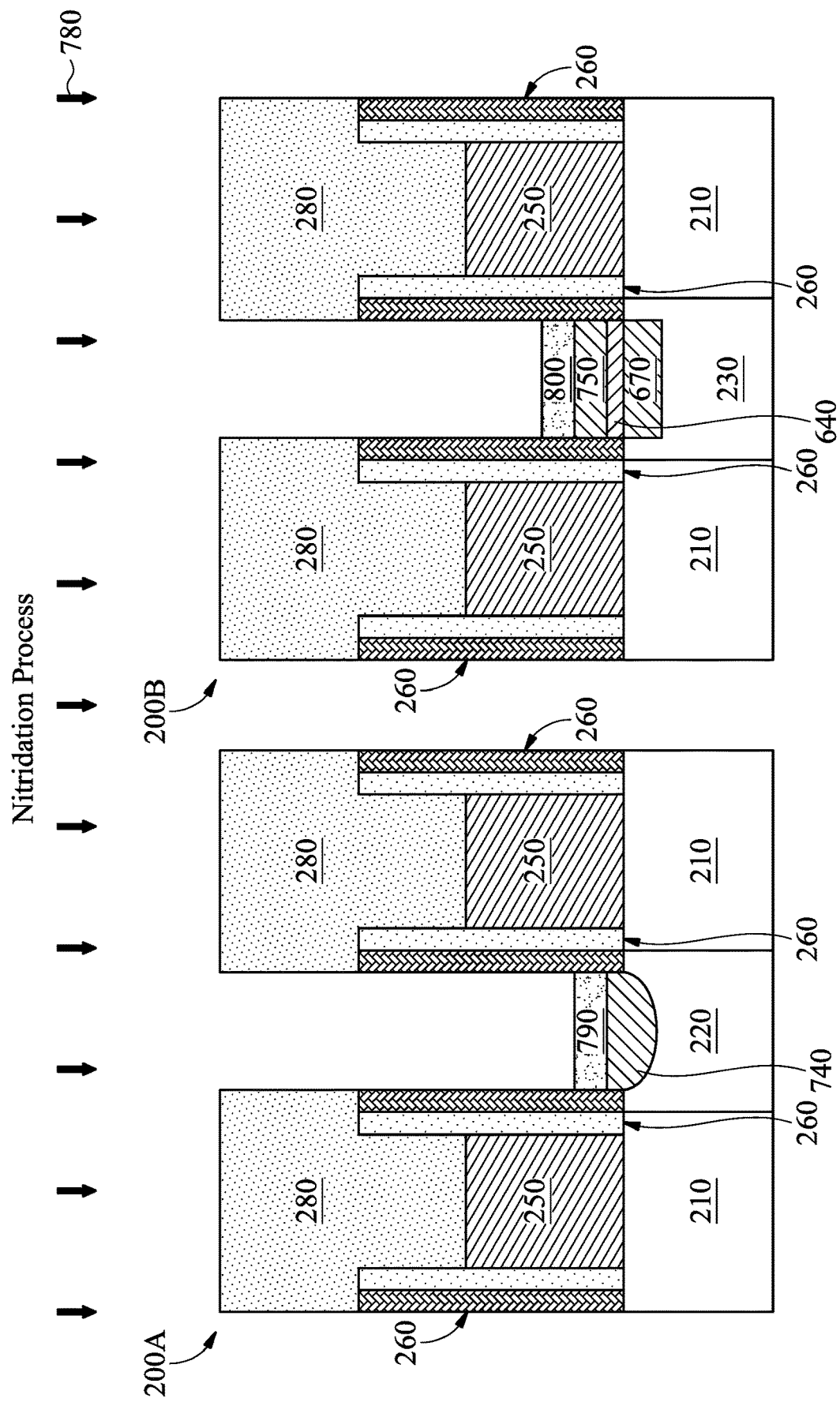

Referring now to FIG. 16, a nitridation process 780 is performed to form a nitride layer 790 for the NFET device 200A and a nitride layer 800 for the PFET device 200B. The nitride layer 790 is formed over the silicide layer 740, and the nitride layer 800 is formed over the layer 750. In some embodiments, the nitridation process 780 may include a plasma process. For example, the wafer containing the NFET device 200A and the PFET device 200B may be placed in a chamber filled with nitrogen plasma. The nitrogen plasma nitridizes a portion of the silicide layer 740 of the NFET device 200A and a portion of the layer 750 of the PFET device 200B. In some embodiments, the nitride layer 790 may include titanium nitride, hafnium nitride, lanthanum nitride, erbium nitride, ytterbium nitride, or yttrium nitride, etc. Similar to the nitride layer 390, the nitride layer 790 formed for the NFET device 200A may serve as a barrier layer to prevent or reduce diffusion of materials from a conductive contact (to be formed above the nitride layer 790) into the layers below (e.g., into the silicide layer 740).

Figure 17:
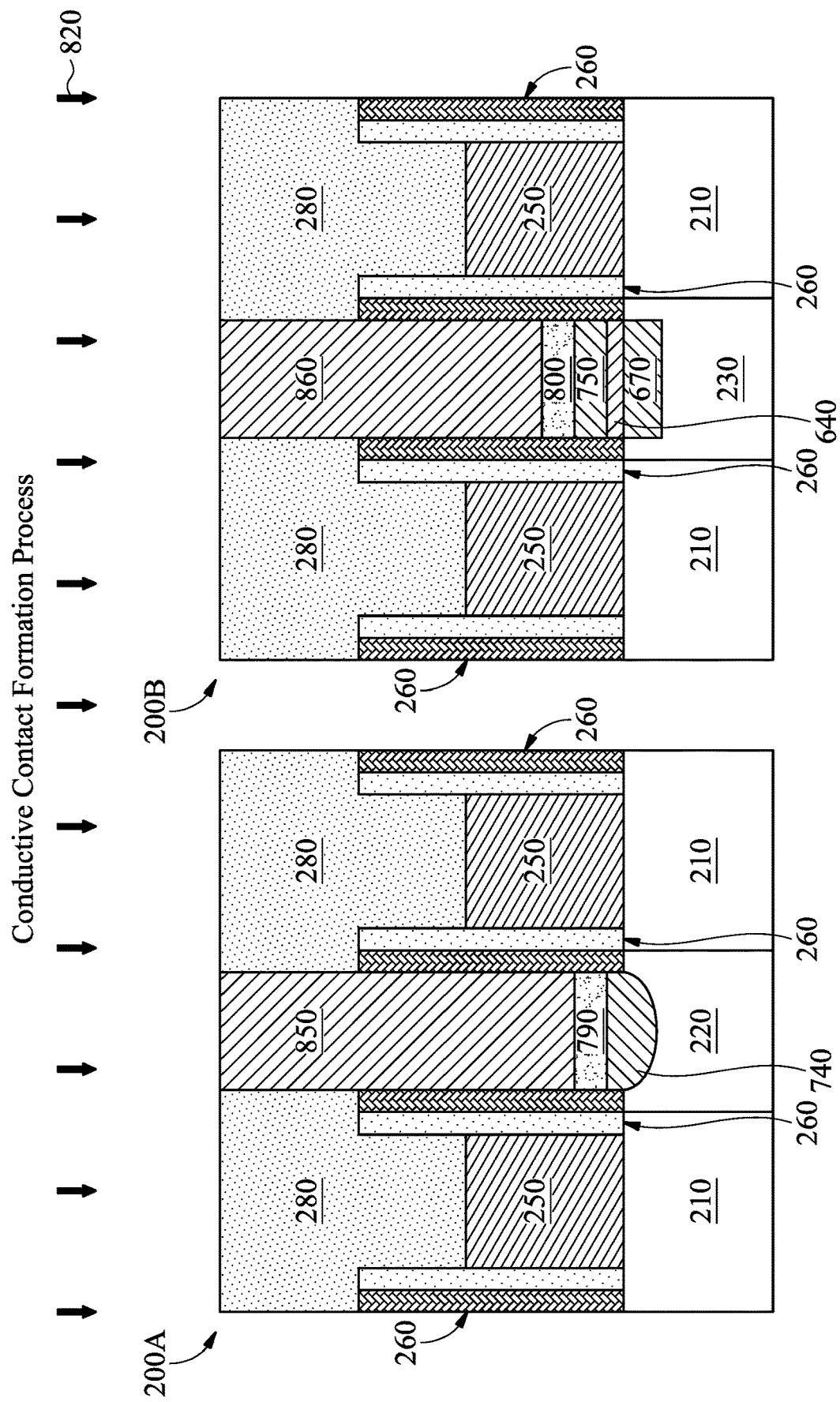

Referring now to FIG. 17, a conductive contact formation process 820 is performed to form a conductive contact 850 for the NFET device 200A and a conductive contact 860 for the PFET device 200B. In various embodiments, the conductive contact formation process 820 may include a metal deposition process, for example a CVD process. In some embodiments, the CVD process is performed using a process temperature in a range between about 50 degrees Celsius and about 500 degrees Celsius, a carrier gas of argon or nitrogen, and with a flow rate in a range between about 10 standard cubic centimeters per minute (sccm) and about 500 sccm. In other embodiments, the metal deposition process may include ALD, electroplating (ECP), electronless deposition (ELD), or a reflow process.

In some embodiments, the metal deposition is selective such that it is deposited on the nitride layers 790 and 800, but not on the ILD 280. This helps with the trench filling performance, as well as obviating the need to perform a polishing process such as chemical mechanical polishing (CMP) process to remove the metal material deposited on the ILD 280. In other embodiments, however, the conductive contact formation process 820 may not be selective, and thus the ILD 280 may have metal materials deposited thereon, which may be removed by a CMP process performed later.

Similar to the conductive contacts 450 and 460 discussed above, the conductive contacts 850 and 860 are formed to have a conductive material (e.g., such as a metal material) with low electrical resistivity and a high work function. In various embodiments, the conductive material of the conductive contacts 450 and 460 may include nickel (Ni), ruthenium (Ru), tungsten (W), cobalt (Co), molybdenum (Mo), or combinations thereof. As discussed above, since the conductive contact 850 is formed on the nitride layer 790—instead of being formed directly on the silicide layer 740—the present disclosure lessens the concern of diffusion of the high work function materials from the conductive contact 850 into the silicide layer 740.

Also similar to the embodiments discussed above with reference to FIG. 8 or FIG. 10, one of the unique physical characteristics of the embodiment shown in FIG. 17 is the asymmetrical silicide layers between the NFET device 200A and the PFET device 200B. For example, due to the removal of the dielectric layer 610, the NFET device 200A may have a recess into the source/drain region 220. The PFET device 200B does not have such a recess, and thus the resulting silicide layers 740 and 670 for the NFET device 200A and PFET device 200B are different not just in material composition, but in their geometric shapes/profiles too. For example, a protrusion of the silicide layer 740 into the source/drain region 220 may be deeper than a protrusion of the silicide layer 670 into the source/drain region 230. Furthermore, whereas the silicide layer 740 is separated from the conductive contact 850 by the nitride layer 790, the silicide layer 670 is separated from the conductive contact 860 by the nitride layer 800, the layer 750, and possibly by the metal material 640 (if the metal material 640 has not been consumed completely during the formation of the silicide layer 670). Thus, the conductive contact 850 may have a great depth or a vertical dimension than the conductive contact 860. Or alternatively stated, a bottom surface of the conductive contact 860 has a more elevated position vertically than a bottom surface of the conductive contact 850. The NFET device 200A in FIG. 17 does not have the metal material 640 or the layer 750. In some embodiments, the silicide layer 740 may be in direct contact with the nitride layer 790.

FIGS. 18-27 illustrate additional diagrammatic fragmentary cross-sectional side views of semiconductor devices according to various embodiments of the disclosure. The cross-sectional side views of FIGS. 18-27 are taken along the Y-direction of FIG. 1. For reasons of consistency and clarity, components that are similar to those shown in FIGS. 2-17 will be labeled the same in FIGS. 18-27.

Figure 18:
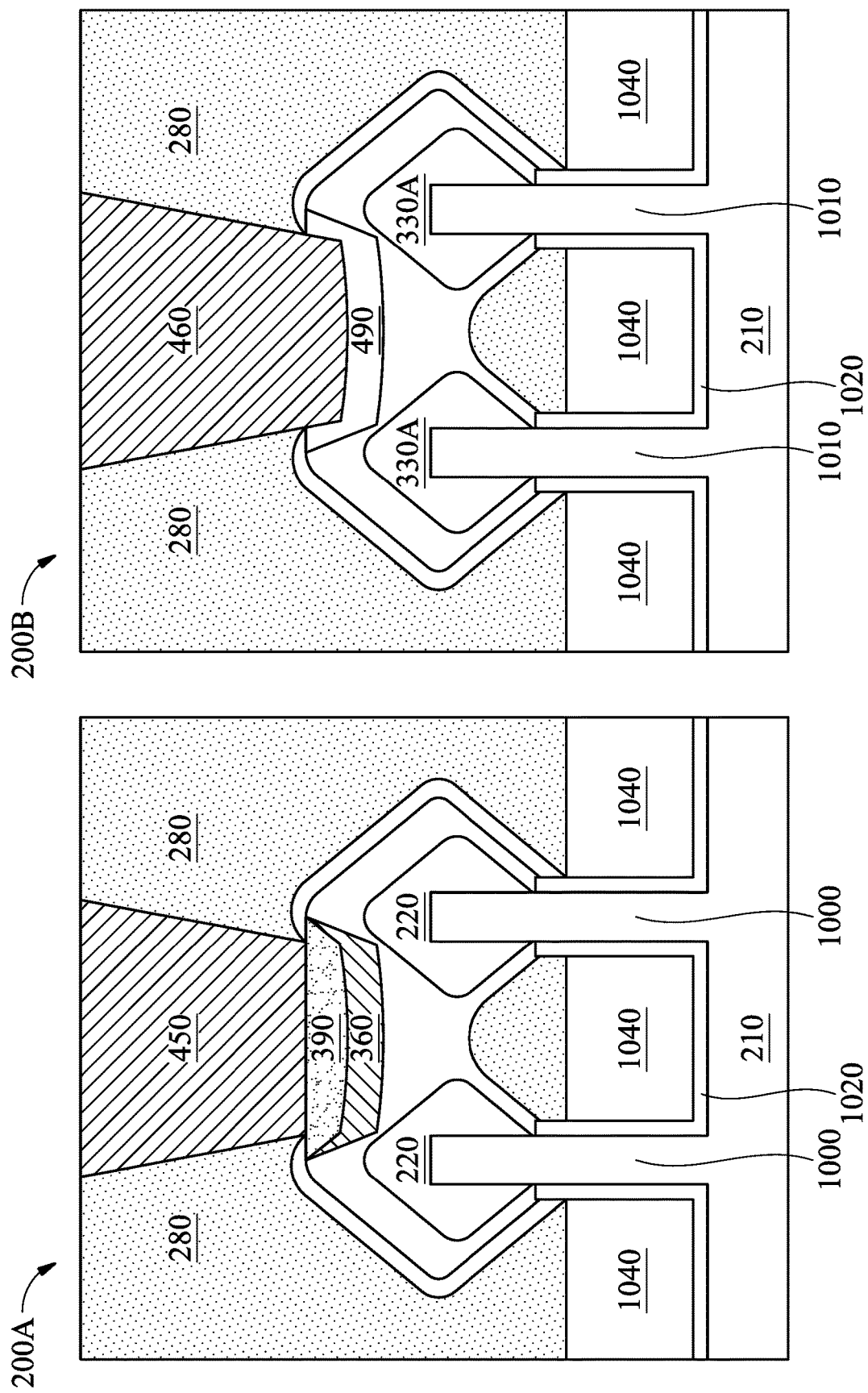

Referring to FIG. 18, an embodiment of the NFET device 200A and the PFET device 200B is illustrated. The NFET device 200A and the PFET device 200B are FinFET devices. For example, the NFET device 200A includes a plurality of fin structures 1000 that protrude upwardly (e.g., in the Z-direction of FIG. 1) out of the substrate 210, and similarly, the PFET device 200B includes a plurality of fin structures 1010 that protrude upwardly out of the substrate 210. The fin structures 1000 may be similar to the fin structures 104 of FIG. 1. In some embodiments, the fin structures 1000 include silicon, while the fin structures 1010 include silicon germanium. A spacer layer 1020 may be formed on a lower portion of the fin structures 1000 and 1010. The spacer layer 1020 may include a dielectric material. The fin structures 1000 and the fin structure 1010 are also separated from one another by an isolation structure 1040. The isolation structure 1040 may be an embodiment of the isolation structure 108 discussed above (e.g., an STI), or it may be another suitable electrically insulating material.

The upper portions of the fin structures 1000 are surrounded by the source/drain regions 220, which may be epitaxially grown on the upper portions of the fin structures 1000. The upper portions of the fin structures 1010 are surrounded by the source/drain regions 330, which may also be epitaxially grown on the upper portions of the fin structures 1010. As discussed above, as non-limiting examples, the source/drain regions 220 may include SiP, while the source/drain regions 330 may include SiGeB. As shown in FIG. 18, the source/drain regions 220 formed on adjacent fin structures 1000 laterally merge into one another, and the source/drain regions 330 formed on adjacent fin structures 1010 laterally merge into one another as well. It is understood that the source/drain region 220 and the source/drain region 330 may each include a plurality of epitaxially grown layers (also referred to as epi-layers) in some embodiments. For example, a first epi-layer may be epitaxially grown on the fin structure 1000 (or on the fin structure 1010), a second epi-layer may be epitaxially grown on the first epi-layer, and a third epi-layer may be epitaxially grown on the second epi-layer, so on and so forth. For reasons of simplicity, however, these different epi-layers are not separately labeled herein.

For the NFET device 200A, a suitable N-metal silicide layer, such as the silicide layer 360 discussed above (e.g., $TiSi_x$, $AlSi_x$, $HfSi_x$, $LiSi_x$, $ErSi_x$, $YbSi_x$, $YSi_x$, or $LaSi_x$, as non-limiting examples), is formed over the source/drain regions 220. For the PFET device 200B, a suitable P-metal silicide layer, such as the silicide layer 490 or the silicide layer 510 discussed above (e.g., $WSi_x$, $MoSi_x$, $RuSi_x$, $NiSi_x$, or $CoSi_x$, as non-limiting examples), is formed over the source/drain regions 330. Due to the differences in their respective material compositions, the silicide layer 490 (or the silicide layer 510) for the PFET device 200B has a higher work function than the silicide layer 360 for the NFET device 200A. As discussed above, the higher work function of the P-metal silicide layer helps to optimize device performance, for example with respect to reduction in contact resistivity.

For the NFET device 200A, the nitride layer 390 (e.g., TiSiN) is formed over the silicide layer 360. The conductive contact 450 is formed over the nitride layer 390. The nitride layer 390 may serve as a barrier layer to prevent or reduce diffusion of materials from the conductive contact 450 into the silicide layer 360 or into the source/drain regions 220. For the PFET device 200B, the conductive contact 460 is formed over the silicide layer 490. Compared to the conductive contact 450, the conductive contact 460 may extend further downward (e.g., deeper into the silicide layer 490). In other words, the bottom surface of the conductive contact 460 may have a lower vertical position in the Z-direction than the bottom surface of the conductive contact 450. The ILD 280 surrounds the conductive contacts 450 and 460 and the source/drain regions 220 and 330.

Figure 19:
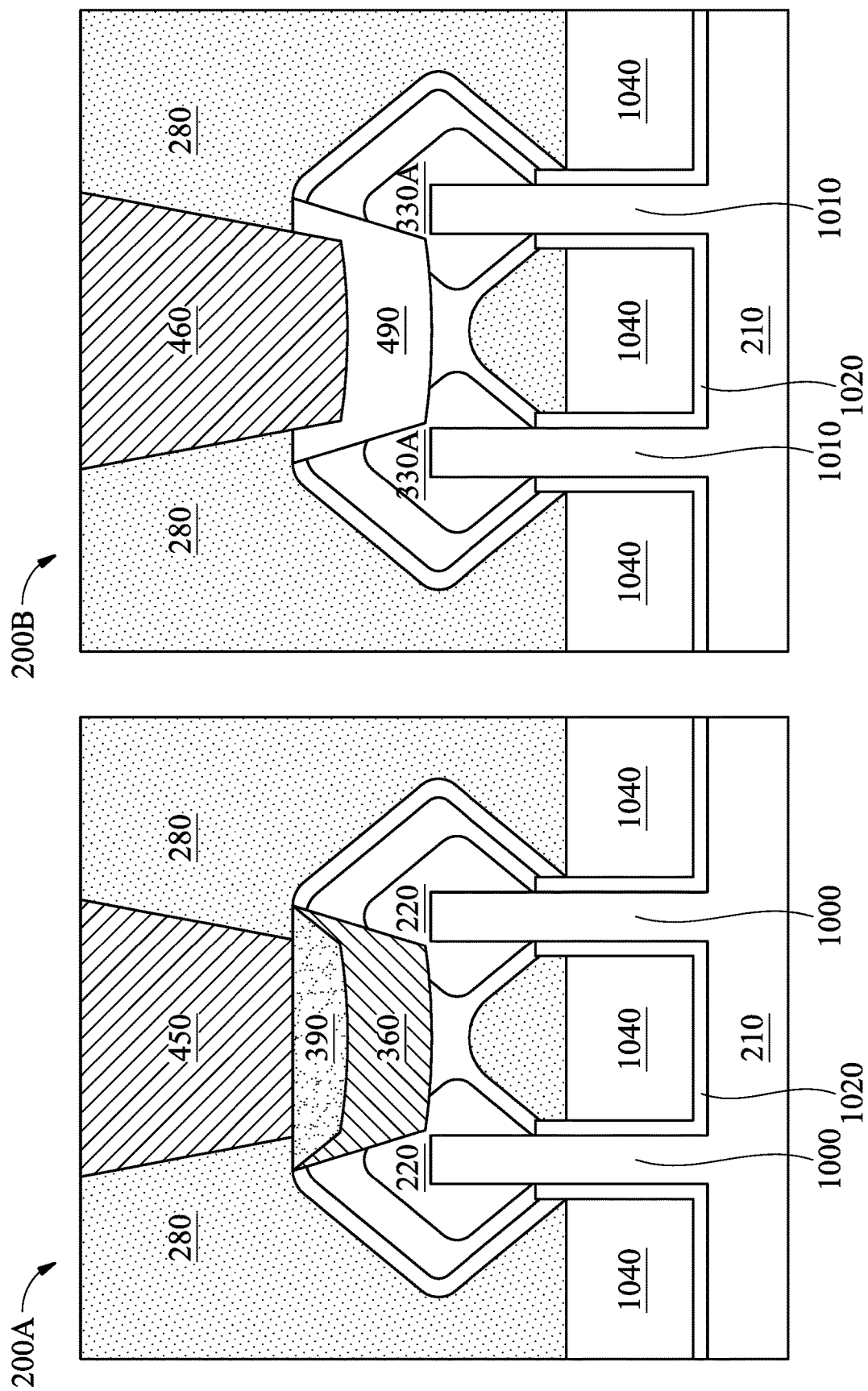

FIG. 19 illustrates the cross-sectional side view of another embodiment of the NFET device 200A and the PFET device 200B. The embodiment shown in FIG. 19 is similar to the embodiment shown in FIG. 18 in many respects. However, the sizes and/or shapes of the silicide layers 360 and 490 may be different between the embodiments shown in FIGS. 18 and 19. For example, the silicide layers 360 and 490 in the embodiment shown in FIG. 19 may each have a greater depth (e.g., vertical dimension) or a greater lateral dimension than their counterparts in the embodiment shown in FIG. 18.

Figure 20:
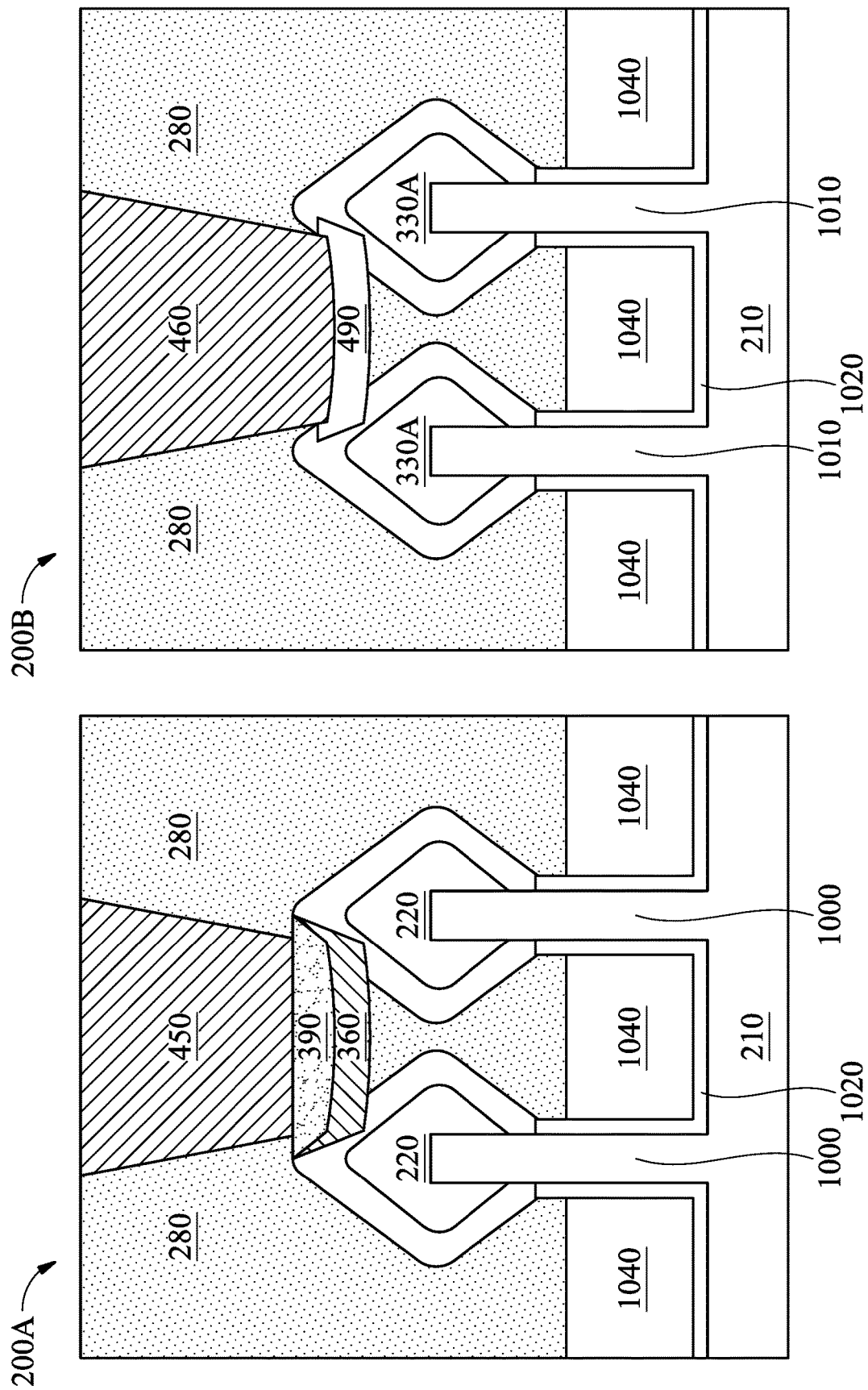

FIG. 20 illustrates the cross-sectional side view of yet another embodiment of the NFET device 200A and the PFET device 200B. The embodiment shown in FIG. 20 is similar to the embodiment shown in FIG. 18 in many respects. However, unlike the embodiment shown in FIG. 18, the source/drain regions 220 grown on adjacent fin structures 1000 do not merge into each other laterally, and the source/drain regions 330 grown on adjacent fin structures 1010 do not merge into each other laterally either. Instead, a portion of the ILD 280 separates the source/drain regions 220 from the adjacent fin structures 1000, and a portion of the ILD 280 separates the source/drain regions 330 from the adjacent fin structures 1010.

Figure 21:
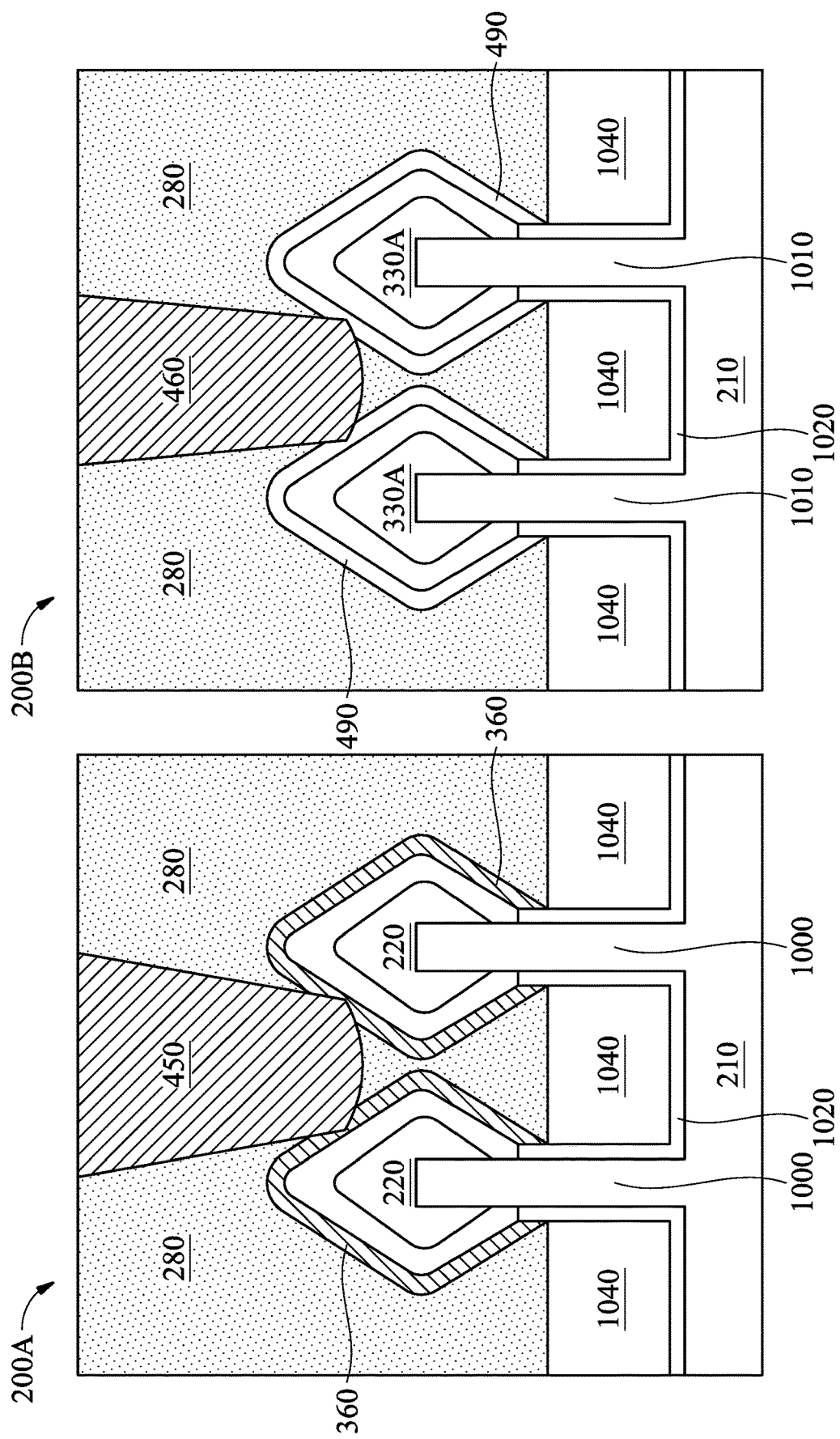
Figure 22:
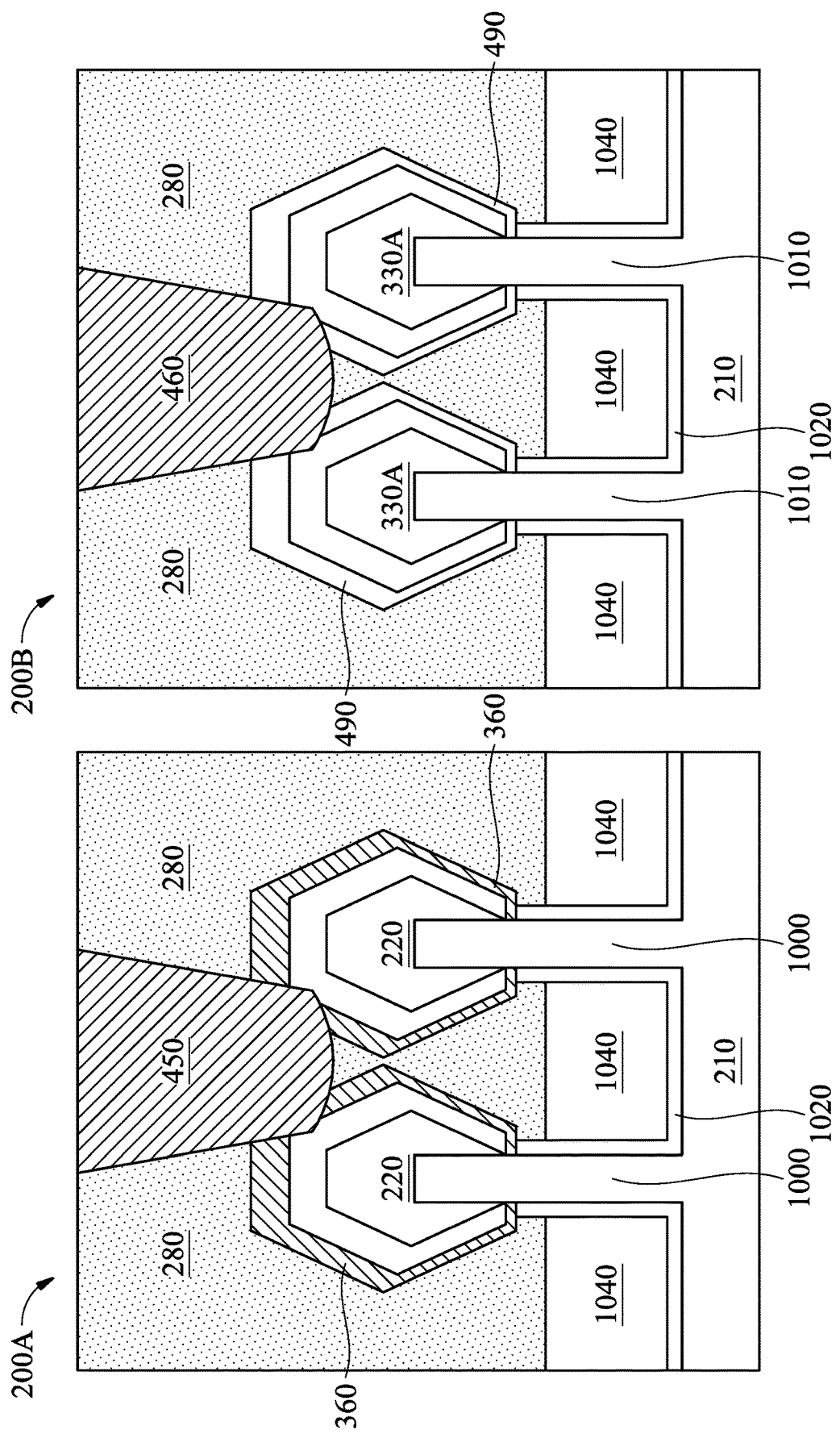
Figure 23:
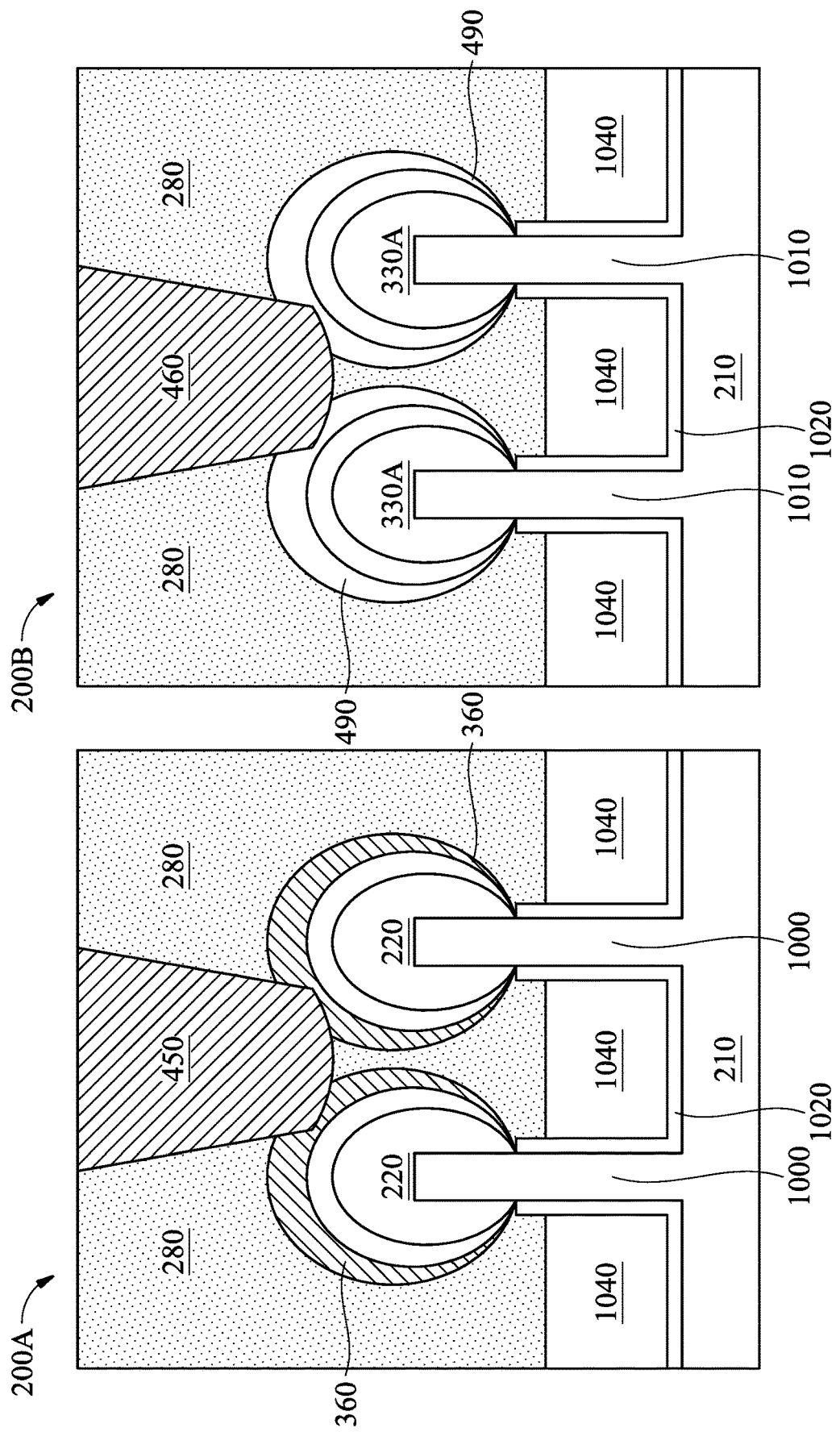

FIG. 21 illustrates the cross-sectional side view of yet another embodiment of the NFET device 200A and the PFET device 200B. The embodiment shown in FIG. 21 is similar to the embodiment shown in FIG. 18 in many respects. However, unlike the embodiment shown in FIG. 18, the silicide layers 360 and 490 are formed to "wrap around" the source/drain regions 220 and 330, respectively. The silicide layers 360 from adjacent source/drain regions 220 may be separated by a portion of the ILD 280 in the illustrated embodiment, or they merge into one another in some other embodiments. Likewise, the silicide layers 490 from adjacent source/drain regions 330 may be separated by a portion of the ILD 280 in the illustrated embodiment, or they merge into one another in some other embodiments FIGS. 22-23 illustrate the cross-sectional side views of some other embodiments of the NFET device 200A and the PFET device 200B. The embodiments shown in FIGS. 22-23 are similar to the embodiments shown in FIG. 18 or 21 in many respects. However, the source/drain regions 220 and/ or 330 may have different shapes than their counterparts of the embodiments shown in FIG. 18 or 21. For example, whereas the source/drain regions 220 and/or 330 may have a more "diamond-like" cross-sectional shape in the embodiments shown in FIG. 18 or 21, the source/drain regions 220 and/or 330 may have an approximately polygonal (e.g., hexagonal) cross-sectional shape in the embodiment shown in FIG. 22, and they may have an oval or circular cross-sectional shape in the embodiment shown in FIG. 23. Other shapes of the source/drain regions 220/330 are also contemplated in other embodiments.

In the embodiments shown in FIGS. 22-23, the silicide layers 360 and 490 may "wrap around" the source/drain regions 220 and 330, respectively, like the embodiment shown in FIG. 21. Alternatively, the silicide layers 360 and 490 may also be formed on an upper portion of the source/drain regions 220 and 330, respectively, like the embodiment shown in FIG. 18. Furthermore, the silicide layers 360 and 490 from adjacent source/drain regions 220 and 330 may merge into one another in some embodiments, or they may be separated by a portion of the ILD 280 in other embodiments.

Figure 24:
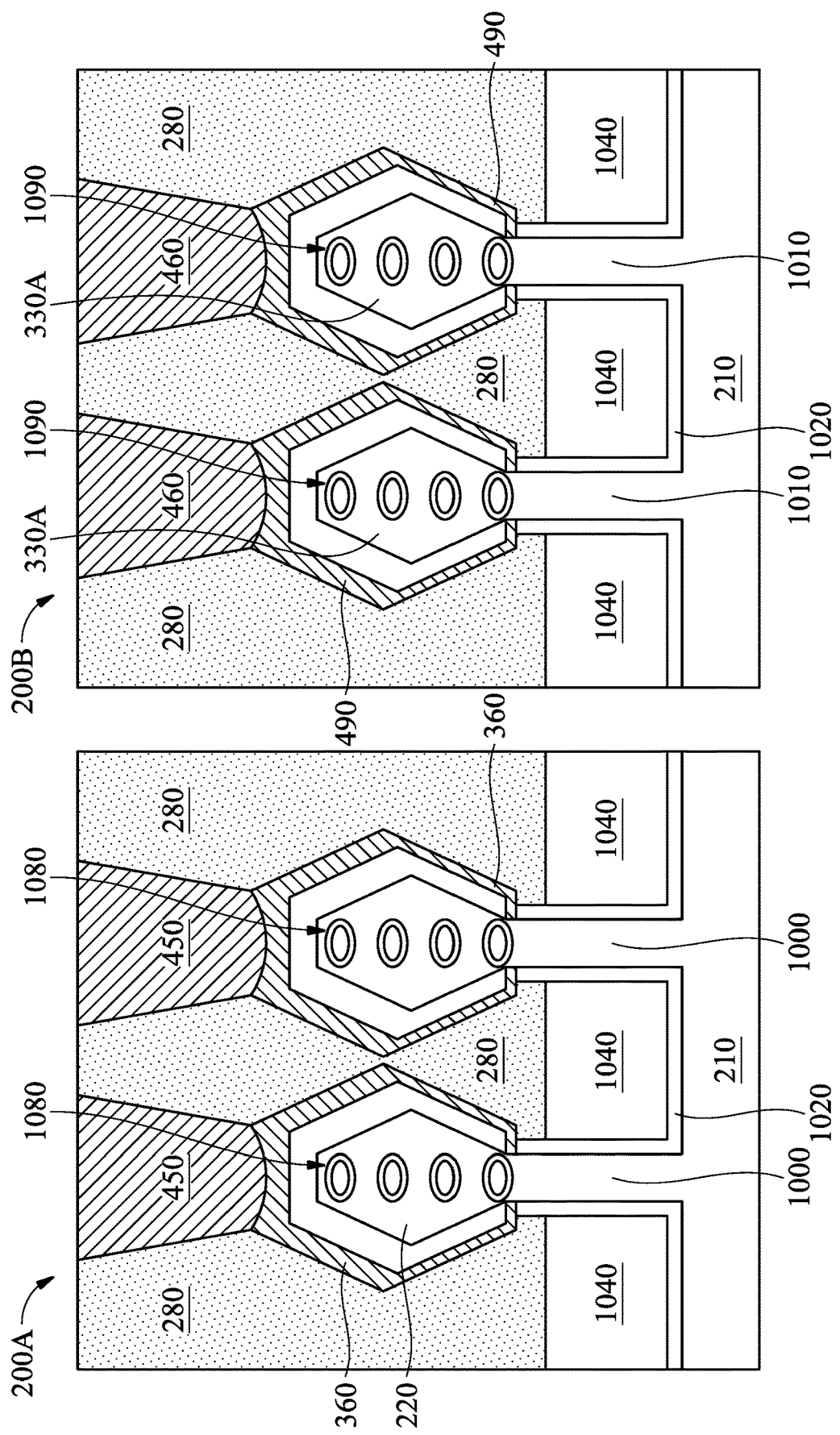
Figure 25:
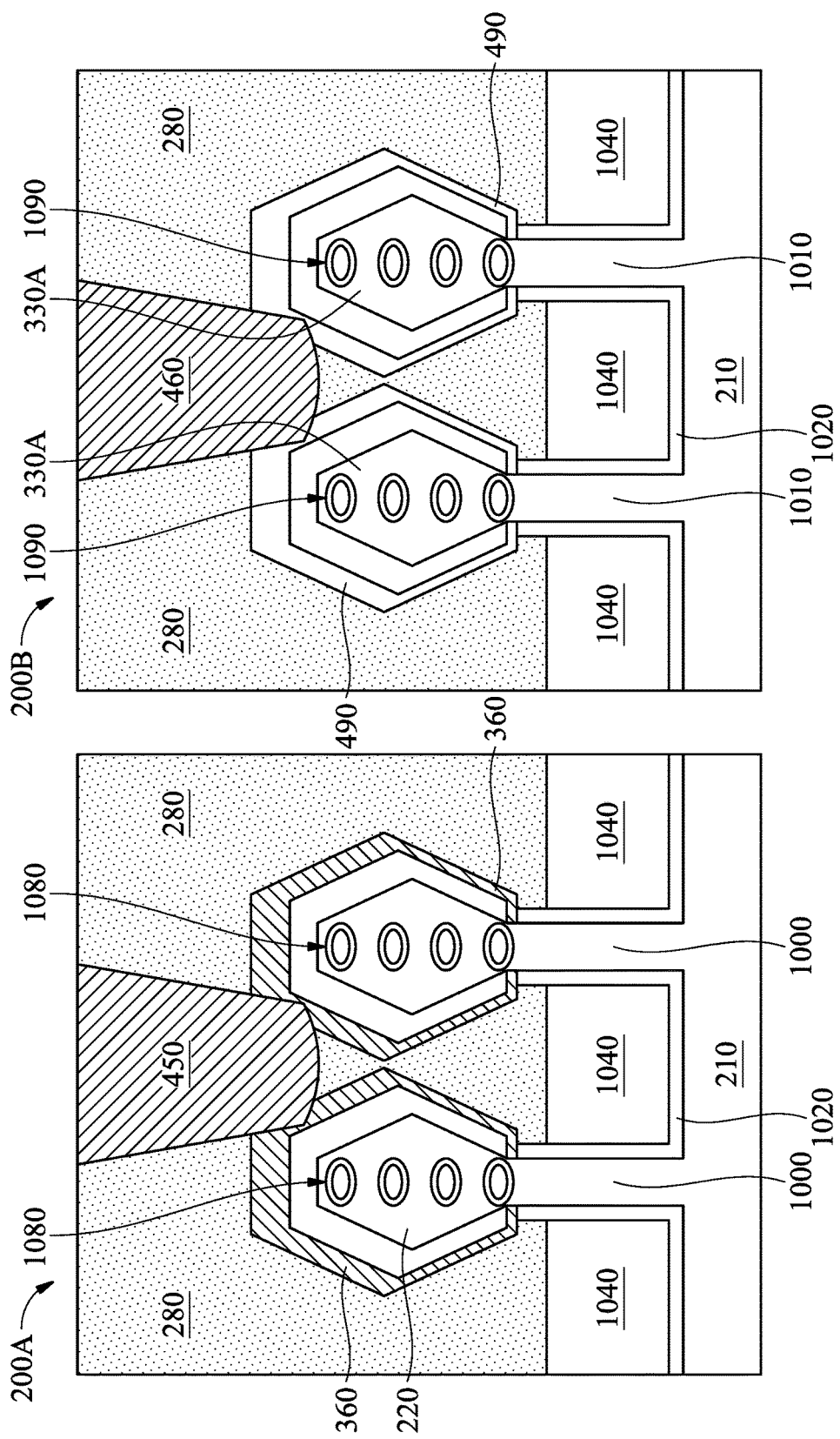

FIGS. 24-25 illustrate the cross-sectional side views of some other embodiments of the NFET device 200A and the PFET device 200B. The embodiments shown in FIGS. 24-25 are similar to the embodiments shown in FIG. 18 or 21-22 in many respects. However, the NFET device 200A and the PFET device 200B are "gate-all-around" (or GAA) devices in the embodiments shown in FIGS. 24-25. For example, the source/drain regions 220 and/or 330 may be formed to include a plurality of nano-wire structures 1080 and 1090, respectively. The nano-wires 1080 and 1090 may include silicon and silicon germanium, respectively, and they may each extend in the X-direction of FIG. 1. Additional details of GAA devices are described in U.S. patent application Ser. No. 15/666,715, filed on Aug. 2, 2017, entitled "Threshold Voltage Adjustment For A Gate-All-Around Semiconductor Structure", and U.S. Pat. No. 9,620,607, filed on Dec. 4, 2014, issued on Mar. 22, 2017, entitled "Gate All Around Device Structure And Fin Field Effect Transistor (FinFET) Device Structure", the entire contents of which are hereby incorporated in their respective entireties.

In the embodiments shown in FIG. 24, a different conductive contact 450 is formed over each of the source/drain regions 220, for example over each of the silicide layers 360. Likewise, a different conductive contact 460 is formed over each of the source/drain regions 330, for example over each of the silicide layers 490. In comparison, in the embodiment shown in FIG. 25, the conductive contact 450 is formed over both of the source/drain regions 220, for example over both of the silicide layers 360. In other words, multiple source/drain regions 220 may "share" the same conductive contact 450. Likewise, the conductive contact 460 is formed over both of the source/drain regions 330, for example over both of the silicide layers 490. In other words, multiple source/drain regions 330 may "share" the same conductive contact 460.

Figure 26:
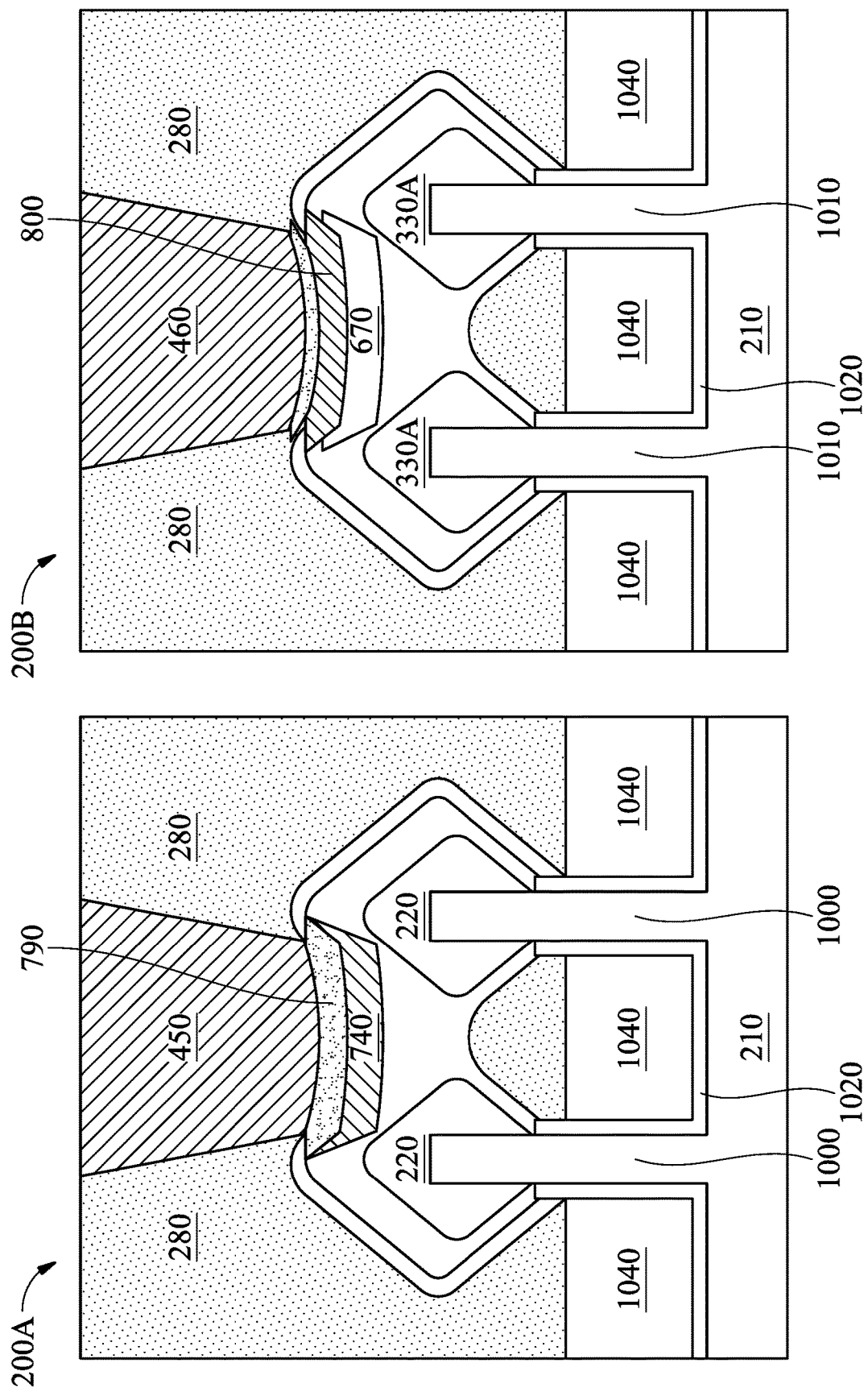

It is understood that the embodiments discussed above with reference to FIGS. 18-25 correspond to the process flow in which the N-metal silicide layer (e.g., the silicide layer 360) is formed before the P-metal silicide layer (e.g., the silicide layer 490 or 510). FIG. 26 illustrates an embodiment corresponding to the process flow in which the P-metal silicide layer (e.g., the silicide layer 490 or 510) is formed first. The embodiment shown in FIG. 26 is similar in many respects to the embodiment shown in FIG. 18. However, for the NFET device 200A, the silicide layer 740 (rather than the silicide layer 360) is formed over the source/drain regions 220, and the nitride layer 790 (rather than the nitride layer 390) is formed over the silicide layer 740. For the PFET device, the silicide layer 670 (rather than the silicide layer 490 or 510) is formed over the source/drain region 330, and the nitride layer 800 is formed over the silicide layer 670. The formation details of the layers 740, 790, 670, and 800 are discussed above with reference to FIGS. 11-17 (i.e., the P-silicide-first process flow).

It is understood that the alternative embodiments discussed above with reference to FIGS. 19-25 may also be implemented for the process flow in which the P-metal silicide layer is formed before the N-metal silicide layer. In other words, in these alternative P-metal-silicide-first embodiments, the depth and/or coverage of the N-metal and/or P-metal silicide layers may vary, the source/drain regions from adjacent fin structures may or may not merge into one another, the silicide layers may be formed to wrap around the source/drain regions, the source/drain regions themselves may be formed to have different shapes or sizes and may even include nano-wire structures (e.g., implemented as GAA devices), and there may be single or multiple conductive contacts for the source/drain regions. For reasons of simplicity, these alternative embodiments are not discussed in detail below.

It is also understood that the silicide layers for the NFET device 200A and the silicide layers for the PFET device 200B may each be selectively deposited using processes discussed above with reference to FIGS. 2-17. In other words, as a part of the selective deposition process, no mask is required to cover up the other regions of the wafer where the silicide layer (whether it is for the NFET device 200A or for the PFET device 200B) is not supposed to be deposited. For example, FIG. 27 illustrates an embodiment where the silicide layer 360 is selectively deposited over the source/drain regions 220, and the silicide layer 490 is selectively deposited over the source/drain regions 330. In addition, the conductive contact 450 is selectively formed over the nitride layer 390, and the conductive contact 460 is selectively formed over the silicide layer 490. The selective formation of the conductive contacts 450 and 460 allows them to have different material compositions. For example, in some embodiments, the conductive contact 450 may be formed to include aluminum, while the conductive contact 460 may be formed to include ruthenium, tungsten, nickel, copper, or molybdenum, etc.

FIG. 28 is a flowchart illustrating a method 1200 according to an embodiment of the present disclosure. The method 1200 includes a step 1210, in which a first dielectric layer is selectively formed such that it is formed over a source/drain region of a first type of transistor but not over a source/drain region of a second type of transistor. The first type of transistor and the second type of transistor have different types of conductivity. For example, one of them is an NFET device, and the other one of them is PFET device.

The method 1200 includes a step 1220, in which a first silicide layer is selectively formed such that it is formed over the source/drain region of the second type of transistor but not over the source/drain region of the first type of transistor.

The method 1200 includes a step 1230, in which the first dielectric layer is removed.

The method 1200 includes a step 1240, in which a second silicide layer is formed over the source/drain region of the first type of transistor.

In some embodiments, the first type of transistor includes a PFET, the second type of transistor includes an NFET, the first silicide layer is formed to have a first work function, and the second silicide layer is formed to have a second work function greater than the first work function.

In some embodiments, the first type of transistor includes an NFET, the second type of transistor includes a PFET, the first silicide layer is formed to have a first work function, and the second silicide layer is formed to have a second work function less than the first work function.

In some embodiments, the first dielectric layer is removed by etching a recess into the source/drain region of the first type of transistor.

In some embodiments, the second silicide layer is formed by directly depositing the second silicide layer over the source/drain region of the first type of transistor. In these embodiments, the method 1200 may further include a step of forming a first conductive contact over the first silicide layer and forming a second conductive contact over the second silicide layer.

It is understood that additional processes may be performed before, during, or after the steps 1210-1240 of the method 1200. For example, in some embodiments, the method 1200 may include a step of forming a second dielectric layer over the first silicide layer. In these embodiments, the step 1210 may include forming an oxide material as the first dielectric layer, the step 1240 may include forming a nitride material as the second dielectric layer. In embodiments where the first type of transistor includes a PFET, and the second type of transistor includes an NFET, the second dielectric layer is formed before the removing the first dielectric layer and is formed for the NFET but not for the PFET. In embodiments where the first type of transistor includes an NFET, and the second type of transistor includes a PFET, the second dielectric layer is formed after the removing the first dielectric layer and is formed for both the NFET and the PFET. As another example, in some embodiments, before the step 1240 is performed (to form the second silicide layer), the method 1200 may include a step of forming a first conductive contact over the first silicide layer and forming a second conductive contact over the source/drain region of the first type of transistor. The second silicide layer may be formed by performing an annealing process to cause a reaction between the second conductive contact and the source/drain region of the first type of transistor device, which then facilitates the formation of the second silicide layer. For reasons of simplicity, other additional steps are not discussed herein in detail.

In summary, the present disclosure performs a maskless fabrication process to selectively and separately form the silicide layers for the NFET and the PFET. In an N-silicide-first process flow, a dielectric layer is first formed over the source/drain for the PFET to temporarily prevent silicide from being formed for the PFET, and then the NFET silicide is formed. The silicide formation may include direct deposition. After the formation of the NFET silicide, the dielectric layer is removed for the PEFT, and the PFET silicide is then formed. In a P-silicide-first process flow, a dielectric layer is first formed over the source/drain for the NFET to temporarily prevent silicide from being formed for the NFET, and then the PFET silicide is formed, which may include a metal deposition followed by an annealing process. After the formation of the PFET silicide, the dielectric layer is removed for the NFET. The NFET silicide is then formed, which may be done using direct deposition.

Based on the above discussions, it can be seen that the present disclosure offers advantages over conventional FinFET fabrication. It is understood, however, that other embodiments may offer additional advantages, and not all advantages are necessarily disclosed herein, and that no particular advantage is required for all embodiments. One advantage is that the NFET silicide and the PFET silicide have different material compositions and different work functions, for example the PFET silicide can be formed to have a higher work function than the NFET silicide. This reduces the resistivity of the conductive contacts formed over the silicides. Another advantage is that since the formation of the dual silicides (for both NFET and PFET) does not require extra masks, it simplifies the fabrication process flow and therefore reduces cost. Yet another advantage is that the present disclosure forms a dielectric layer (such as the nitride layer 390) that can serve as a barrier layer to prevent or reduce diffusion of materials from the conductive contact into the layers below (e.g., into the silicide). Other advantages include compatibility with existing fabrication processes, so the present disclosure is therefore easy and convenient to implement.

It is understood that the present disclosure is not limited to FinFET devices and may apply to planar devices as well.

One aspect of the present disclosure pertains to a method of fabricating a semiconductor device. A first dielectric layer is selectively formed such that the first dielectric layer is formed over a source/drain region of a first type of transistor but not over a source/drain region of a second type of transistor. The first type of transistor and the second type of transistor have different types of conductivity. A first silicide layer is selectively formed such that the first silicide layer is formed over the source/drain region of the second type of transistor but not over the source/drain region of the first type of transistor. The first dielectric layer is removed. A second silicide layer is formed over the source/drain region of the first type of transistor.

Another one aspect of the present disclosure pertains to a semiconductor device. The semiconductor device includes an NFET and a PFET. The NFET includes: a first source/drain region; a first silicide layer disposed over the first source/drain region, the first silicide layer having a first work function; and a first conductive contact disposed over the first silicide layer. The PFET includes: a second source/drain region; a second silicide layer disposed over the second source/drain region, the second silicide layer having a second work function that is higher than the first work function; and a second conductive contact disposed over the second silicide layer. The first silicide layer has a more elevated position than the second silicide layer.

Yet another aspect of the present disclosure pertains to a semiconductor device. The semiconductor device includes an NFET and a PFET. The NFET includes: a first source/drain region; a first silicide layer disposed over the first source/drain region, the first silicide layer having a first work function; a first dielectric layer disposed over the first silicide layer; and a first conductive contact disposed over the first dielectric layer. The PFET includes: a second source/drain region; a second silicide layer disposed over the second source/drain region, the second silicide layer having a second work function that is greater than the first work function; a conductive layer disposed over the second silicide layer; a second dielectric layer disposed over the conductive layer; and a second conductive contact disposed over the second dielectric layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method of fabricating a semiconductor device, comprising:
   selectively forming a first dielectric layer such that the first dielectric layer is formed over a source/drain region of a first type of transistor but not over a source/drain region of a second type of transistor, wherein the first type of transistor and the second type of transistor have different types of conductivity;
   selectively forming a first silicide layer such that the first silicide layer is formed over the source/drain region of the second type of transistor but not over the source/drain region of the first type of transistor;
   forming a second dielectric layer over the first silicide layer, wherein the second dielectric layer and the first dielectric layer have different material compositions, and wherein the second dielectric layer is formed for one of, but not both, the first type of transistor and the second type of transistor;
   removing the first dielectric layer after the second dielectric layer has been formed; and
   forming a second silicide layer over the source/drain region of the first type of transistor.

2. The method of claim 1, wherein:
   the selectively forming the first dielectric layer comprises forming an oxide material as the first dielectric layer; and
   the forming the second silicide layer comprises forming a nitride material as the second dielectric layer.

3. The method of claim 1, wherein:
   the first type of transistor includes a PFET;
   the second type of transistor includes an NFET; and
   the second dielectric layer is formed for the NFET but not for the PFET.

4. The method of claim 1, wherein:
   the first type of transistor includes a PFET;
   the second type of transistor includes an NFET;
   the selectively forming the first silicide layer comprises forming the first silicide layer having a first work function; and
   the forming the second silicide layer comprises forming the second silicide layer having a second work function greater than the first work function.

5. The method of claim 1, wherein:
   the first type of transistor includes an NFET;
   the second type of transistor includes a PFET;
   the selectively forming the first silicide layer comprises forming the first silicide layer having a first work function; and
   the forming the second silicide layer comprises forming the second silicide layer having a second work function less than the first work function.

6. The method of claim 1, wherein the removing the first dielectric layer comprises etching a recess into the source/drain region of the first type of transistor.

7. The method of claim 1, wherein the forming of the second silicide layer comprises directly depositing the second silicide layer over the source/drain region of the first type of transistor, and wherein the method further comprises: forming a first conductive contact over the first silicide layer and forming a second conductive contact over the second silicide layer.

8. The method of claim 1, further comprising: before the forming the second silicide layer, forming a first conductive contact over the first silicide layer and forming a second conductive contact over the source/drain region of the first type of transistor, wherein the forming the second silicide layer comprises performing an annealing process to cause a reaction between the second conductive contact and the source/drain region of the first type of transistor, thereby forming the second silicide layer.

9. A method of fabricating a semiconductor device, comprising:
   forming a first dielectric layer over a source/drain region of a first transistor but not over a source/drain region of a second transistor, wherein one of the first transistor and the second transistor is a PFET, and the other one of the first transistor and the second transistor is an NFET;
   forming a first silicide layer over the source/drain region of the second transistor but not over the source/drain region of the first transistor;
   forming a second dielectric layer over the first silicide layer, wherein the first dielectric layer and the second dielectric layer have different material compositions, and wherein the second dielectric layer is formed for one of, but not both, the first transistor and the second transistor;
   removing the first dielectric layer after the first silicide layer and the second dielectric layer are formed; and
   forming a second silicide layer over the source/drain region of the first transistor after the first dielectric layer is removed.

10. The method of claim 9, wherein:
    the selectively forming the first silicide layer comprises forming the first silicide layer having a first work function; and
    the forming the second silicide layer comprises forming the second silicide layer having a second work function greater than or less than the first work function.

11. The method of claim 9, wherein the removing the first dielectric layer comprises etching a recess into the source/drain region of the first transistor.

12. The method of claim 9, wherein the forming of the second silicide layer comprises directly depositing the second silicide layer over the source/drain region of the first transistor, and wherein the method further comprises: forming a first conductive contact over the first silicide layer and forming a second conductive contact over the second silicide layer.

13. The method of claim 9, further comprising: before the forming the second silicide layer, forming a first conductive contact over the first silicide layer and forming a second conductive contact over the source/drain region of the first transistor, wherein the forming the second silicide layer comprises performing an annealing process to cause a reaction between the second conductive contact and the source/drain region of the first transistor, thereby forming the second silicide layer.

14. A method of fabricating a semiconductor device, comprising:
    forming a first dielectric layer over a source/drain region of a first transistor but not over a source/drain region of a second transistor, wherein one of the first transistor and the second transistor is a PFET, and the other one of the first transistor and the second transistor is an NFET;

forming a first silicide layer over the source/drain region of the second transistor but not over the source/drain region of the first transistor, wherein the first silicide layer is associated with a first work function;

forming a second dielectric layer over the first silicide layer, wherein the first dielectric layer and the second dielectric layer have different material compositions, and wherein the second dielectric layer is formed in the NFET but not in the PFET;

after the forming the second dielectric layer, removing the first dielectric layer at least in part by etching a recess into the source/drain region of the first transistor; and forming a second silicide layer over the source/drain region of the first transistor, wherein the second silicide layer is associated with a second work function that is different from the first work function.

15. The method of claim 14, wherein the first transistor is the PFET, and wherein the second transistor is the NFET.

16. The method of claim 14, wherein the first dielectric layer contains oxide, and wherein the second dielectric layer contains nitride.

17. The method of claim 14, wherein the first silicide layer and the second silicide layer are formed to have different work functions.

18. The method of claim 14, further comprising: after the first dielectric layer has been formed, growing an epi-layer over the source/drain region of the second transistor, wherein the first silicide layer is formed on the epi-layer.

19. The method of claim 1, further comprising: after the first dielectric layer has been formed, growing an epi-layer over the source/drain region of the second type of transistor, wherein the first silicide layer is formed on the epi-layer.

20. The method of claim 9, further comprising: after the first dielectric layer has been formed, growing an epi-layer over the source/drain region of the NFET, wherein the first silicide layer is formed on the epi-layer.

* * * * *